US007801634B2

(12) United States Patent
Kurata et al.

(10) Patent No.: US 7,801,634 B2
(45) Date of Patent: Sep. 21, 2010

(54) MANUFACTURING MANAGEMENT METHOD, MANUFACTURING MANAGEMENT APPARATUS, AND MOUNTER

(75) Inventors: Hiroaki Kurata, Saga (JP); Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 404 days.

(21) Appl. No.: 11/914,530

(22) PCT Filed: Jun. 7, 2006

(86) PCT No.: PCT/JP2006/311445

§ 371 (c)(1),
(2), (4) Date: Nov. 15, 2007

(87) PCT Pub. No.: WO2006/132282

PCT Pub. Date: Dec. 14, 2006

(65) Prior Publication Data

US 2009/0099678 A1    Apr. 16, 2009

(30) Foreign Application Priority Data

Jun. 10, 2005  (JP)  .............. 2005-171545
Jul. 19, 2005  (JP)  .............. 2005-208255
Jul. 19, 2005  (JP)  .............. 2005-209242

(51) Int. Cl.
 *G06F 19/00*  (2006.01)
 *G06F 11/30*  (2006.01)
 *G21C 17/00*  (2006.01)
 *B23P 19/00*  (2006.01)

(52) U.S. Cl. .............. 700/108; 700/99; 700/100; 700/169; 700/171; 700/174; 702/182; 702/183; 29/739; 29/740

(58) Field of Classification Search .............. 700/97, 700/99–100, 106–110, 169, 171, 173–174; 702/84, 182–186; 29/739–740
See application file for complete search history.

(56) References Cited

U.S. PATENT DOCUMENTS 5,321,620 A    6/1994    Tanaka et al.
(Continued)

FOREIGN PATENT DOCUMENTS

JP          01-183348          7/1989
(Continued)

OTHER PUBLICATIONS

International Search Report issued Sep. 5, 2006 in the International (PCT) Application of which the present application is the U.S. National Stage.
(Continued)

*Primary Examiner*—Ramesh B Patel
(74) *Attorney, Agent, or Firm*—Winderoth, Lind & Ponack, L.L.P.

(57) ABSTRACT

A mounter for a manufacturing management method suppresses an occurrence of inventory shortage or excess inventory as much as possible, and provides energy savings when manufacturing is not performed at full capacity. A throughput determining step acquires manufacturing information included in a manufacturing plan while manufacturing equipment is manufacturing mounted boards and determines a throughput of the manufacturing equipment for the mounted boards based on the manufacturing information while the manufacturing equipment is manufacturing a sequence of the mounted boards. A manufacturing condition determining step determines a manufacturing condition for decreasing power consumption of the manufacturing equipment within a range of throughput not lower than the determined throughput in the case where the throughput determined in the throughput determining step is equal to or lower than a current throughput of the manufacturing equipment.

18 Claims, 31 Drawing Sheets

U.S. PATENT DOCUMENTS

| | | |
|---|---|---|
| 5,442,731 A | 8/1995 | Tanaka et al. |
| 5,822,210 A * | 10/1998 | Kobayashi et al. .......... 700/121 |
| 5,946,663 A * | 8/1999 | Tanaka et al. ................... 705/8 |
| 6,128,626 A * | 10/2000 | Beauchesne ....................... 1/1 |
| 6,971,161 B1 * | 12/2005 | Maenishi et al. .............. 29/832 |
| 6,996,440 B2 * | 2/2006 | Maenishi et al. .............. 700/28 |
| 7,142,936 B2 * | 11/2006 | Yokomori et al. ............. 700/97 |
| 7,155,303 B2 * | 12/2006 | Sagasaki et al. ............. 700/173 |
| 2002/0073537 A1 * | 6/2002 | Sumi ........................... 29/832 |
| 2003/0060904 A1 | 3/2003 | Szoke et al. |
| 2003/0200130 A1 * | 10/2003 | Kall et al. ....................... 705/8 |
| 2003/0221853 A1 * | 12/2003 | Shiozawa .................... 174/50 |
| 2004/0073472 A1 | 4/2004 | Sakuma et al. |
| 2004/0122545 A1 | 6/2004 | Akiyama et al. |
| 2004/0153868 A1 * | 8/2004 | Nonaka et al. ................. 714/47 |
| 2005/0004831 A1 | 1/2005 | Najimi et al. |
| 2005/0010323 A1 * | 1/2005 | Cocciadiferro et al. ...... 700/174 |
| 2006/0041448 A1 * | 2/2006 | Patterson et al. ............... 705/1 |

FOREIGN PATENT DOCUMENTS

| | | |
|---|---|---|
| JP | 03-218527 | 9/1991 |
| JP | 5-298324 | 11/1993 |
| JP | 11-053007 | 2/1999 |
| JP | 11-250158 | 9/1999 |
| JP | 2000-5979 | 1/2000 |
| JP | 2002-50900 | 2/2002 |
| JP | 2002-149219 | 5/2002 |
| JP | 2004-102367 | 4/2004 |

OTHER PUBLICATIONS

Supplementary European Search Report (in English language) issued Oct. 17, 2008 in European Application No. 06 76 6471.

Partial English translation of JP 2002-149219, which was cited in the IDS filed Nov. 15, 2007.

* cited by examiner

| Component Name | Component (appearance) | Component size (mm) X | Y | L | Two-dimensional recognizing method | Pickup nozzle | Takt (seconds) | Maximum speed level |
|---|---|---|---|---|---|---|---|---|
| 0603CR | | 0.6 | 0.3 | 0.25 | | SX | 0.086 | 1 |
| 1005CR | | 1.0 | 0.5 | 0.3-0.5 | | SA | 0.094 | |
| 1608CR | | 1.6 | 0.8 | 0.4-0.8 | | S | | |
| 2012CR | | 2.0 | 1.25 | 0.4-0.8 | | | | |
| 3216CR | | 3.2 | 1.6 | 0.4-0.8 | | | | |
| 4TR | | 2.8 | 2.8 | 1.1 | Reflection | Cylindrical Chip | 0.11 | |
| 6TR | | 4.3 | 4.5 | 1.5 | | | | |
| 1TIP | | 2.0 | φ1.0 | - | | S | | |
| 2TIP | | 3.6 | φ1.4 | - | | | | |
| 1CAP | | 3.8 | 1.9 | 1.6 | | | | |
| 2CAP | | 4.7 | 2.6 | 2.1 | | M | | 2 |
| 3CAP | | 6.0 | 3.2 | 2.5 | | | | |
| 4CAP | | 7.3 | 4.3 | 2.8 | | | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6-2.4 | | M | 0.13 | |
| 2VOL | | 3.7 | 3.0 | 1.6 | | | | |
| 3VOL | | 4.8 | 4.0 | 3.0 | | | | |

FIG. 30

| Component Name | Component size (mm) | | | Two-dimensional recognizing method | Pickup nozzle | Acceleration |
|---|---|---|---|---|---|---|
| | X | Y | L | | | |
| 0603CR | 0.6 | 0.3 | 0.25 | | SX | |
| 1005CR | 1.0 | 0.5 | 0.3-0.5 | | SA | |
| 1608CR | 1.6 | 0.8 | 0.4-0.8 | | S | 1 |
| 2012CR | 2.0 | 1.25 | 0.4-0.8 | | | |
| 3216CR | 3.2 | 1.6 | 0.4-0.8 | | | |
| 4TR | 2.8 | 2.8 | 1.1 | Reflection | | |
| 6TR | 4.3 | 4.5 | 1.5 | | | |
| 1TIP | 2.0 | φ1.0 | - | | For cylindrical chip | |
| 2TIP | 3.6 | φ1.4 | - | | | |
| 1CAP | 3.8 | 1.9 | 1.6 | | S | |
| 2CAP | 4.7 | 2.6 | 2.1 | | | |
| 3CAP | 6.0 | 3.2 | 2.5 | | | |
| 4CAP | 7.3 | 4.3 | 2.8 | | | |
| SCAP | 4.3 | 4.3 | 6.0 | | M | 2 |
| LCAP | 6.6 | 6.6 | 6.0 | | | |
| LLCAP | 10.3 | 10.3 | 10.5 | | ML | |
| 1VOL | 4.5 | 3.8 | 1.6-2.4 | | M | |
| 2VOL | 3.7 | 3.0 | 1.6 | | | |
| 3VOL | 4.8 | 4.0 | 3.0 | | | |

First mounter: operating conditions  *Click numeric figure to allow manual input.

| Board | Manufacturing target Acquired /Planned | Maximum takt time (1 /throughput) | Manufacturing quantity | Start time Acquired /Planned | Termination time Acquired /Planned | Operating rate Acquired /Planned |
|---|---|---|---|---|---|---|
| A | 1000/900 | 100SEC | 150 | 8:30 /8:30 | 12:00 /12:00 | 80% /70% |
| B | 0/500 | 50SEC | 0 | 12:00 /12:00 | 13:00 /13:00 | 100% /100% |
| C | 0/200 | 75SEC | 0 | 13:30 /13:30 | 17:00 /17:00 | 40% /40% |
| D | 0/500 | 40SEC | 0 | 17:00 /17:00 | 23:00 /23:00 | 85% /85% |

Comments

4/1 Target manufacturing quantity increased to 1000!

4/1 Machine trouble occurred!  Interruption time: 30 minutes

4/1 Board B target manufacturing quantity planning to decrease

MANUFACTURING MANAGEMENT METHOD, MANUFACTURING MANAGEMENT APPARATUS, AND MOUNTER

BACKGROUND

1. Technical Field

The present invention relates to a manufacturing management method for a mounter which manufactures mounted boards by mounting components on boards. The present invention also relates to a manufacturing management method for a manufacturing line including plural mounters.

2. Background Art

Conventionally, manufacturing lines have been used when manufacturing mounted boards by mounting electronic components onto boards, such as printed circuit boards. These manufacturing lines are manufacturing lines which manufacture mounted boards on moving assembly line in which apparatuses with respective roles are arranged in line. The assembly line includes: an apparatus for printing solders on boards; an apparatus for applying adhesive to the boards; an apparatus for mounting electronic components onto the boards; and an apparatus for soldering the electronic components to the boards.

In order to obtain a high throughput for the manufacturing line as a whole, a high throughput is also required for each manufacturing apparatus, for example, a mounter which mounts components onto boards. Thus, in order to realize this, for the mounter, hardware measures for transporting components at high speed in each of the following processes are adopted: a pickup process in which each component to be supplied to the mounter is picked up, held, and lifted by vacuum; a transporting process in which the picked-up component is transported from a component supply unit to a point above a board; and a mounting process in which the transported component is placed down and mounted onto the surface of the board. Meanwhile, software measures are adopted for optimizing the arrangement sequence of component feeders and component tapes, and optimizing the arrangement sequence of components (See Patent Reference 1, for example).

Thus, by maintaining a high-throughput manufacturing line like this, mounted boards are manufactured as planned fully in accordance with a manufacturing plan that is drafted based on a sales forecast, which is information from the sales department and so on.

Patent Reference 1: Japanese Unexamined Patent Application Publication No. 2002-50900

However, information such as sales forecasts, which serves as a base for manufacturing planning, is mere predicted values. Meanwhile, a manufacturing plan is drafted for a comparatively long span, for example, by the year or by the month. Thus, it is often the case that a difference occurs between the mounted boards to be manufactured according to daily operation planning based on such manufacturing planning and the mounted boards to be actually shipped (sold).

If any difference occurs like this between the planned value and the result value, a situation arises which necessitates storage of finished mounted boards within a manufacturing factory, that is, carrying an inventory, while inventory runs out which makes it impossible to ship (sell) the mounting boards as a result of manufacturing bottleneck.

Generally, inventory shortage affects downstream processes, for example, even a process in which products are finished by attaching a mounted board. Thus, a manufacturing plan tends to generate excess inventory rather than inventory shortage. Any generation of such inventory necessitates storage space for mounted boards and thus causes storage expenses and so on.

In addition, in order to deal with unstable factors such as an abrupt change in planning despite a margin for delivery time, it is more likely to try to finish manufacturing a predetermined quantity at an earlier date by continuing the manufacturing of mounted boards while keeping a high throughput. In this case, the manufacturing plan is achievable but results in a waste of electric power and an increase in inventory. This leads to an increase in costs including electric expenses.

FIG. 1 is a diagram for illustrating inventory.

For example, assume that, within a factory there are a mounting line 602 which can manufacture 200 boards A per day and a mounting line 604 which can manufacture 150 boards B per day. To this factory, assume that an order 606 of "manufacture 150 boards A and 120 boards B" arrives. In this case, when the two mounting lines 602 and 604 are fully operated to manufacture 200 boards A and 150 boards B, and when the ordered quantity of boards are shipped, the inventory of boards A is 50 (=200−150), while the inventory of boards B is 30 (=150−120). Thus, this leads to cost losses. Note that such inventory of products to be shipped from the factory will be hereinafter referred to as "shipment inventory."

In addition, in the case where plural mounting lines manufacture a single board or a single product in an interrelated manner and where the plural mounting lines have different takt times with a bad line balance, an inventory is generated in the manufacturing process of boards. Thus, this case also presents a problem which leads to cost losses resulting from carrying an inventory. Note that such inventory generated in the manufacturing process of products will be hereinafter referred to as "process inventory."

FIG. 2 is a diagram for illustrating a problem related to the process inventory as described above.

For example, assume that there are a board A mounting line 608 for manufacturing boards A and a board B mounting line 610 for manufacturing boards B, and that an assembly process 612 for a board A and a board B follows the two mounting lines 608 and 610. Furthermore, assume that boards A and boards B are manufactured in parallel on the board A mounting line 608 and the board B mounting line 610. In this case, assume that the line takt time (time required for manufacturing a board) for the board A mounting line 608 is 12 seconds, while the line takt time for the board B mounting line 610 is 20 seconds. Thus, when compared in the quantity of boards to be manufactured per unit time, there are more boards A. Consequently, boards A remain as process inventory.

In addition, FIG. 3 is another diagram for illustrating the above problem of process inventory. A manufacturing system 626 shown in the figure is a system for mounting components onto both sides of a board, and includes: a back surface mounting line 622, a stocker 30a, a conveyer 154, a board reversing apparatus 156, and a front surface mounting line 624.

The back surface mounting line 622 is a mounting line which mounts components onto the back surface of each board. The stocker 30a stocks each board the back surface of which is mounted with components. The conveyer 154 transports the board stocked in the stocker 30a. The board reversing apparatus 156 reverses the board transported by the conveyer 154. The front surface mounting line 624 is a mounting line which mounts components onto the front surface of the board reversed by the board reversing apparatus 156. In other words, each board flows in sequence in the direction indicated by the arrows in the figure.

In this regard, assume that the line takt time for the back surface mounting line 622 is 12 seconds, while the line takt time for the front surface mounting line 624 is 20 seconds. Thus, compared in the quantity of boards to be manufactured per unit time, there are more back surface boards. Therefore, the manufacturing of the front surface boards cannot keep up with the manufacturing of the back surface boards, and the back surface boards are to be stocked in the stocker 30a as process inventory.

The present invention, having been conceived in view of problems described above, aims to offer a manufacturing management method for a mounter which suppresses the occurrence of inventory shortage or excess inventory as much as possible, and further to offer a manufacturing management method for enabling power savings in the case where the line is not utilized to its full capacity.

SUMMARY

In order to achieve the above object, the manufacturing managing method according to the present invention manages board manufacturing performed by a mounter which mounts a component onto a board, and includes a manufacturing information acquiring step of acquiring manufacturing information and a throughput determining step of determining a throughput based on the manufacturing information.

With this, it becomes possible to determine a throughput based on the acquired manufacturing information so as to suppress inventory shortage or excess inventory as much as possible, and to allow power savings.

It is preferable that the manufacturing information acquiring step should further include a board inventory quantity calculating step of calculating an inventory quantity of boards to be manufactured by the mounting line, and that the throughput determining step should further include a board manufacturing quantity control step of controlling a manufacturing quantity of boards manufactured by the mounting line so that the inventory quantity is equal to or smaller than a predetermined optimum inventory quantity.

With this configuration, the manufacturing quantity of boards is controlled so that the inventory quantity is equal to or smaller than the predetermined inventory quantity. This makes it possible to reduce cost losses resulting from shipment inventory or process inventory.

Furthermore, the manufacturing managing method may be for managing the board manufacturing performed by the mounting line which includes plural mounters each of which mounts a component onto the board. The manufacturing quantity of boards may also be controlled in the board manufacturing quantity control step by increasing manufacturing time in length for the boards in at least one of the mounters included in the mounting line in the case where the inventory quantity is equal to or larger than the optimum inventory quantity.

Specifically, the mounting line may include the mounter which transports a head for picking up the component and mounting the component onto the board. The manufacturing quantity of boards may also be controlled in the board manufacturing quantity control step by decreasing the transportation speed of the head in the mounter included in the mounting line in the case where the inventory quantity is equal to or larger than the optimum inventory quantity.

Alternatively, the manufacturing quantity of boards may also be controlled in the board manufacturing quantity control step by decreasing the number of mounters to be used in component mounting in the case where the inventory quantity is equal to or larger than the optimum inventory quantity.

It is preferable that the board manufacturing quantity managing method should further include a display step of displaying the inventory quantity.

With this configuration, the operator can tell at a glance whether or not the inventory quantity is optimum.

In addition, the board manufacturing quantity managing method may also include a manufacturing condition input accepting step of accepting an input of a manufacturing condition for the mounting line, and a simulation step of causing a computer to simulate the inventory quantity of boards based on the manufacturing condition.

With this configuration, since it is possible to simulate the inventory quantity in advance, the operator can determine an optimum manufacturing condition. This makes it possible to reduce cost losses resulting from shipment inventory or process inventory.

It is preferable that the board inventory quantity simulation method should further include a graph display step of displaying, as a graph, the transition of the simulated inventory quantity of boards.

With this configuration, the operator can tell at a glance whether or not the inventory quantity is optimum.

In addition, it is preferable that, in the manufacturing information acquiring step, manufacturing information included in a manufacturing plan should be acquired while the manufacturing equipment is manufacturing boards, and that, in the throughput determining step, the throughput of the manufacturing equipment for the boards should be determined based on the manufacturing information while the manufacturing equipment is manufacturing a sequence of the boards.

In addition, it is preferable that the manufacturing information acquired in the manufacturing information acquiring step should include the manufacturing quantity of boards or manufacturing time within which boards in the manufacturing quantity should be manufactured.

It is preferable that the manufacturing information acquiring step should further include a sales quantity acquiring step of acquiring the sales quantity of a product in which the board manufactured by the manufacturing equipment is incorporated, and that the manufacturing quantity of boards should be acquired based on the obtained sales quantity.

Furthermore, in the case where the throughput determined in the throughput determining step is equal to or lower than a current throughput of the manufacturing equipment, it is preferable that the manufacturing managing method should include a manufacturing condition determining step of determining a manufacturing condition so that power consumption of the manufacturing equipment decreases with a throughput within a range which is not lower than the determined throughput.

It is preferable that the manufacturing condition determining step should further include a mounting acceleration decreasing step of decreasing a throughput by decreasing acceleration that is generated while the manufacturing equipment is in operation.

Note that the present invention can be realized not only as a manufacturing managing method which includes such characteristic steps but also as a manufacturing managing apparatus having units corresponding to the characteristic steps of the manufacturing managing method, and as a program which causes a computer to execute the characteristic steps of the manufacturing managing method. Naturally, the program like

BRIEF DESCRIPTION OF DRAWINGS

FIG. 10 is a diagram showing an example of a component library.

FIG. 30 is a diagram showing an example of a component library.

FIG. 31 is a diagram showing a screen on which the processing details of this embodiment are reflected.

EFFECTS OF THE INVENTION

Numerical References

Figure 1:
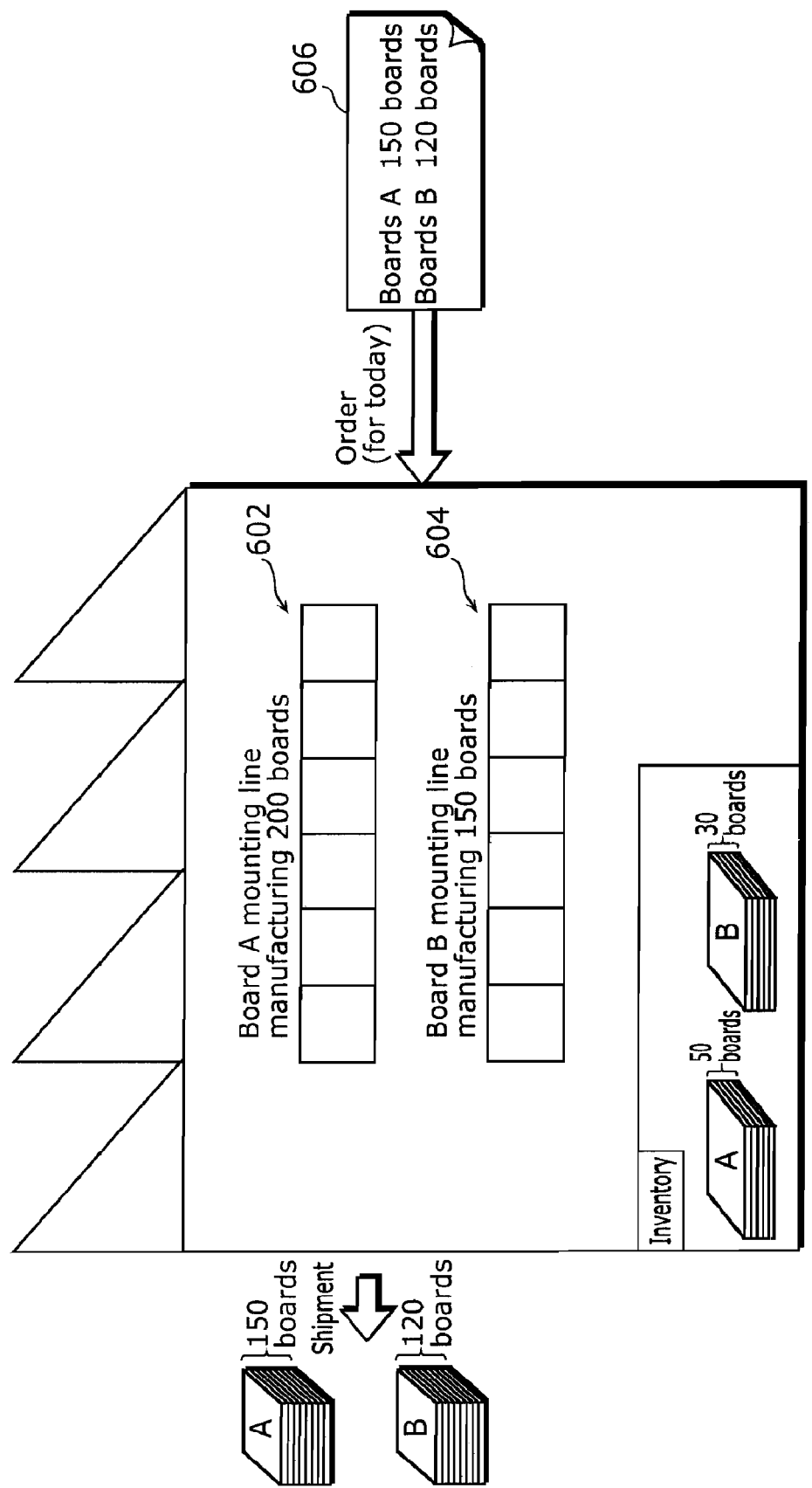
FIG. 1 is a diagram illustrating a problem of conventional technology.
Figure 2:
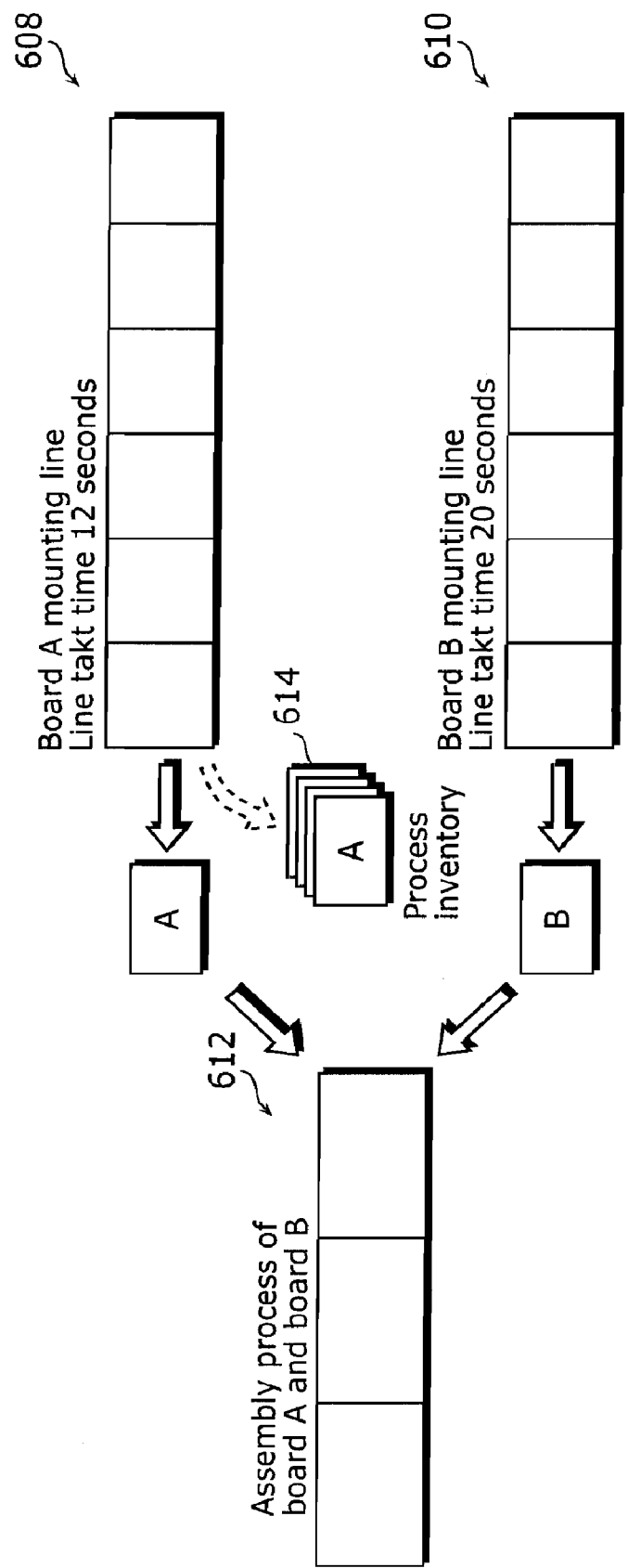
FIG. 2 is a diagram illustrating a problem related to process inventory.
Figure 3:
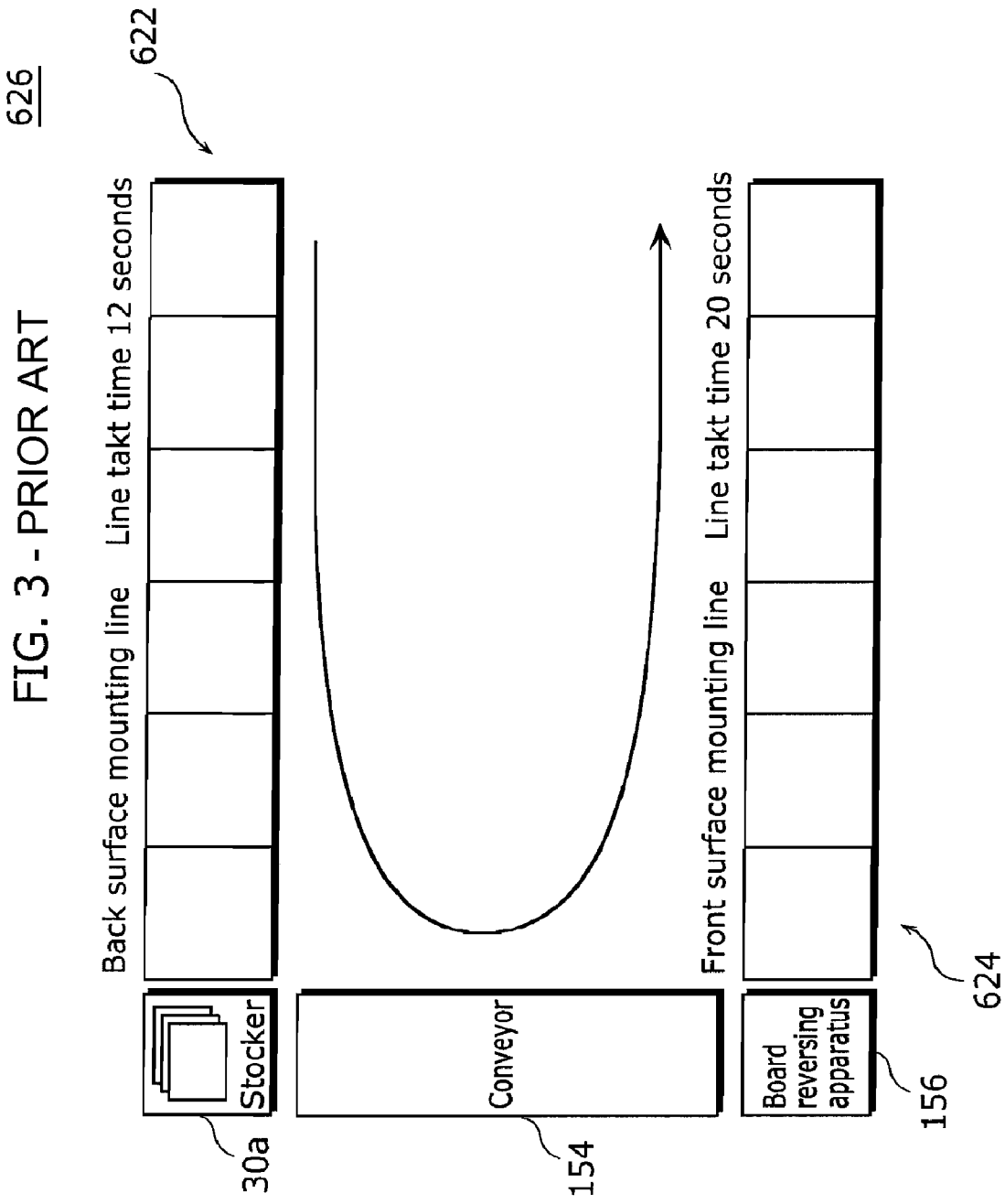
FIG. 3 is another diagram for illustrating the problem of process inventory.

10 Manufacturing system
14, 30 Stocker
16 Solder printer
18, 26 Conveyor
20 Board
22, 24 Mounter
23 Mounting control unit
28 Reflower
100 Manufacturing management apparatus
101 Network
110 Multiple head unit
113 X-Y robot
115 Component supply unit
120 Board
129 Rails
133 Mounting table
200 Mounting line
300 Board manufacturing quantity control apparatus
301 Calculation control unit
302 Display unit
303 Input unit
304 Memory unit
305 Board manufacturing quantity control program storage unit
305a Board inventory quantity calculating unit
305b Board manufacturing quantity control unit
305c Inventory quantity display control unit
305d Mounting sequence determining unit
306 Communication I/F Unit
307a Mounting point data
307b Component library
307c Mounter information
307 Database unit
500 Board inventory quantity simulation apparatus
505 Board inventory quantity simulation program storage unit
505a Simulation unit

DETAILED DESCRIPTION

Hereinafter, a board manufacturing system according to embodiments of the present invention will be described with reference to the drawings.

First Embodiment

In a first embodiment of the present invention, a board manufacturing system which can reduce cost losses resulting from shipment inventory will be described.

Figure 4:
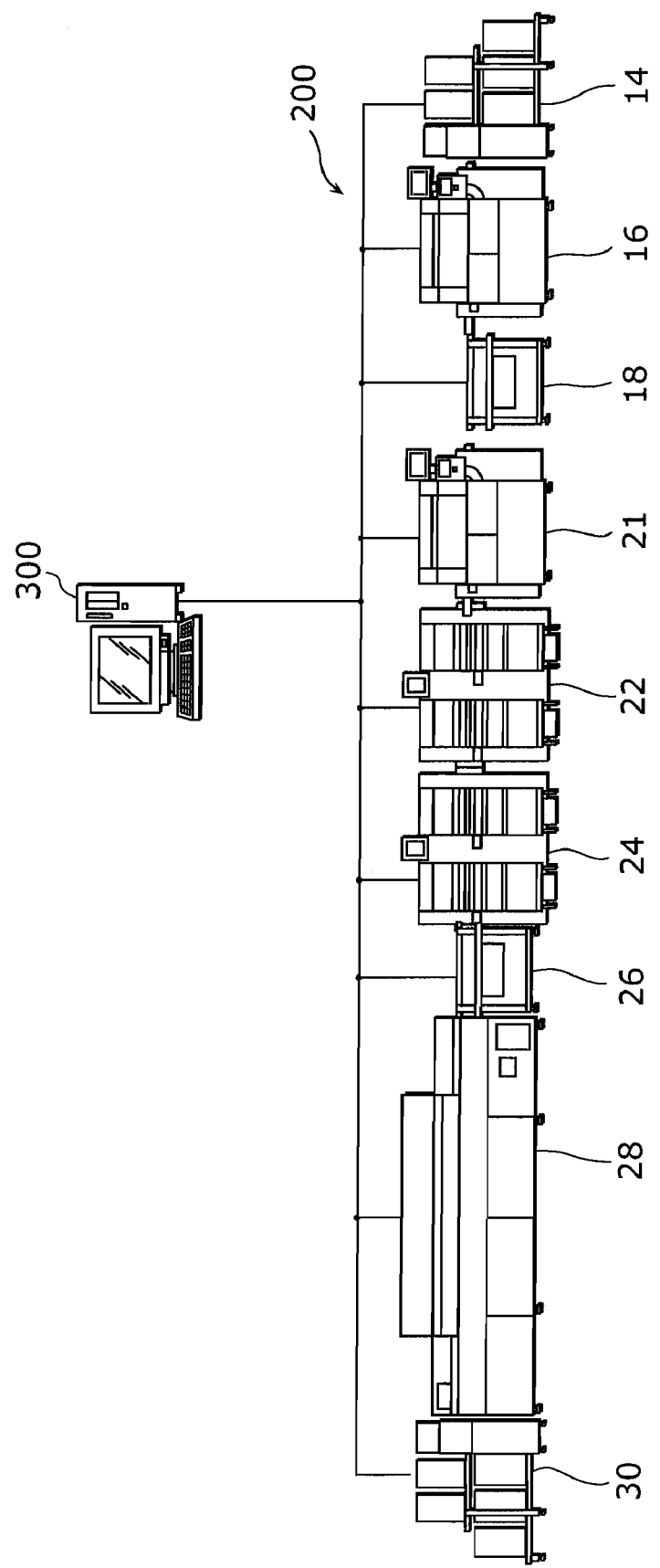
FIG. 4 is an external view of a board manufacturing system according to a first embodiment of the present invention.

FIG. 4 is an external view of a board manufacturing system according to the first embodiment of the present invention. The manufacturing system 10 is a system for manufacturing a component-mounted board which is a board mounted with components, and includes a mounting line 200 and a manufacturing management apparatus 300.

The mounting line 200 is a system for manufacturing the board that is mounted with components as transporting the board from an upstream manufacturing apparatus to a downstream manufacturing apparatus, and includes: stockers 14 and 30; a solder printer 16; conveyors 18 and 26; an adhesive applicator 21; mounters 22 and 24; and a reflower 28.

The stockers 14 and 30 are apparatuses for stocking boards. The stocker 14 is located in the uppermost stream, while the stocker 30 is located in the downmost stream. In other words, a board which is not yet mounted with a component is stocked in the stocker 14, while a finished board mounted with components is stocked in the stocker 30.

The solder printer 16 is an apparatus for printing solders on the board. The conveyors 18 and 26 are apparatuses for transporting the board. The adhesive applicator 21 is an apparatus for applying adhesive to the board. The mounters 22 and 24 are apparatuses for mounting components onto the board. The reflower 28 is an apparatus for fixing components onto the board after melting the solders or the like by heating the board mounted with the components.

The manufacturing management apparatus 300 is a computer for controlling the quantity of boards to be manufactured in each of the manufacturing apparatuses included in the mounting line 200. The structure of the manufacturing management apparatus 300 will be described later.

Figure 5:
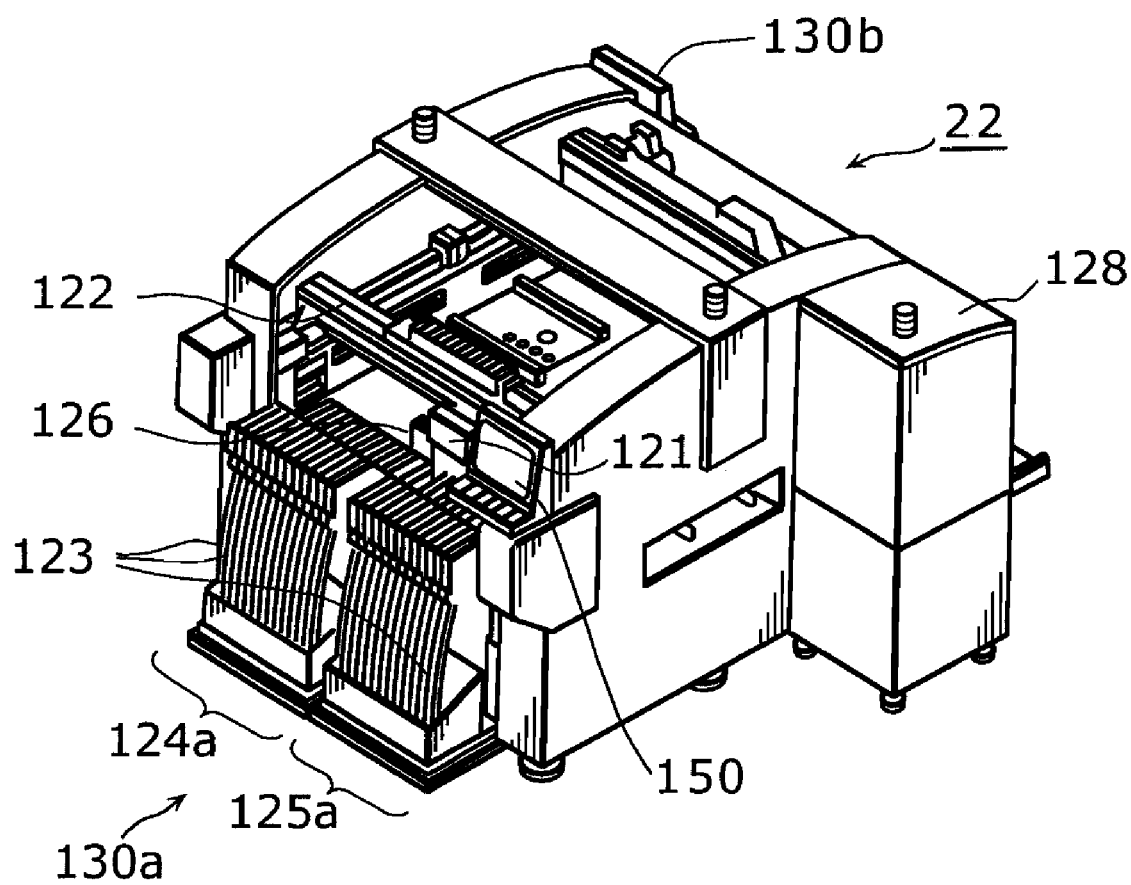
FIG. 5 is an external view showing the structure of the mounter.

FIG. 5 is an external view showing the structure of the mounter 22. Note that the mounter 24 has the same structure.

The mounter 22 includes two stages (a front stage 130a and a rear stage 130b) which mounts components by operating in a coordinated manner (or by alternate operation). The front stage 130a includes: a component supply unit 124a composed of a sequence of component feeders 123 in which component tapes are stored; a multiple mounting head 121 including plural pickup nozzles (hereinafter, simply referred to as "nozzles") which can pickup electronic components from among these component feeders 123 and mount them onto boards 20; a beam 122 to which the multiple mounting head 121 is attached; and a component recognizing camera 126 for inspecting two-dimensionally or three-dimensionally the pickup condition of the components picked up by the multiple mounting head 121.

The rear stage 130b has the same structure as the front stage 130a.

In addition, the rear stage 130b includes a tray supply unit 128 which supplies tray components, while some stages do not include any tray supply unit 128 or the like.

Figure 6:
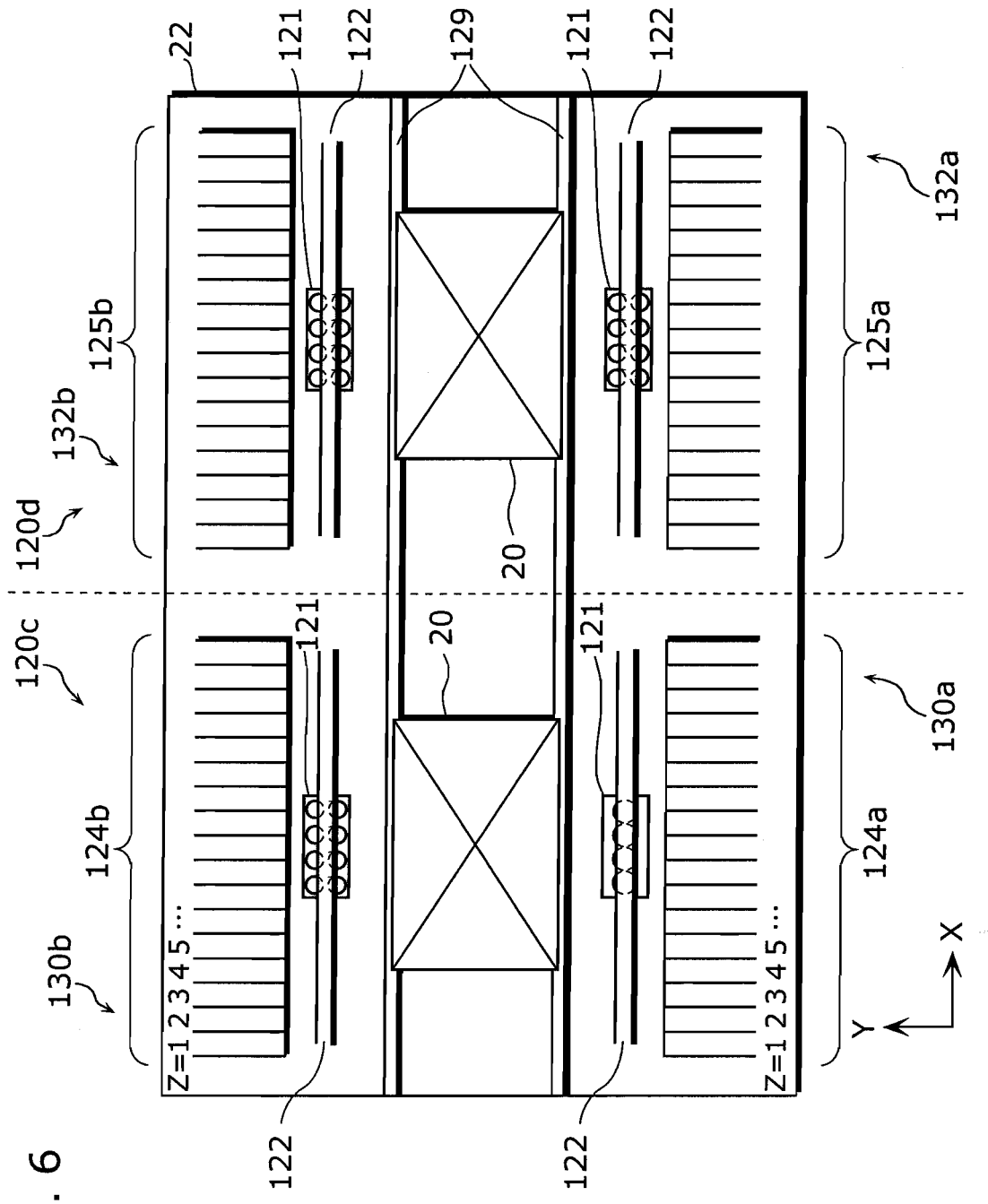
FIG. 6 is a plan view showing the principal structure of the internal parts of the mounter.

FIG. 6 is a plan view showing the principal structure of the internal parts of the mounter 22.

Note that the mounter 22 shown in the FIG. 5 is assumed to include two stages, but, for convenience sake, the description below is based on an assumption that the mounter 22 shown in FIG. 6 shows the internal structure of two mounters 22 connected in the transportation direction of the board 20.

The mounter 22 has, in total, four stages 130a, 132a, 130b, and 132b including: internally, stages that are aligned in the transportation direction of the board 20 (X-axis direction); and, further, stages arranged in the front-rear direction of the mounter 22 (Y-axis direction). The stages aligned in the X-direction (130a and 132a; and 130b and 132b) are independent of each other and can concurrently perform different mounting operations. Furthermore, the stages (130a and 132b; and 132b and 130b) are also independent of each other and can concurrently perform different mounting operations. On the other hand, the stages (130a and 130b; 132a and 132b) arranged oppositely in the front-rear direction (Y-axis direction) perform mounting operations on a single board in a coordinated manner. Hereinafter, the stages 130a and 130b will be collectively called the "left stages 120c," while stages 132a and 132b will be collectively called the "right stages 120d." In other words, in each of the left stages 120c and the right stages 120d, two multiple mounting heads 121 perform mounting operations on the board 20 in a coordinated manner.

The stages 130a, 132a, 130b, and 132b have, respectively: a beam 122, a multiple mounting head 121, and a component supply unit 124a, 125a, 124b, or 125b for each of the stages of 130a, 132a, 130b, and 132b. In addition, the mounter 22 has a pair of rails 129 for transporting the board 20 between the front and the rear stages.

Note that the component recognizing camera 126, the tray supply unit 128 and so on are not the principal object of the present invention, and therefore the description is omitted in the figure.

The beam 122, which is a rigid body extending in an X-axis direction, can move while keeping parallel to the X-axis direction in an orbit (not shown) that is provided in a Y-axis direction (in a direction perpendicular to the transportation direction of the board 20). In addition, the beam 122 can transport the multiple mounting head 121, which is attached to the beam 122, along with the beam 122; that is, in the X-axis direction. Thus, the beam 122 can freely transport the multiple mounting head 121 within an X-Y plane through the movements of the beam 122 in the Y-axis direction and the movements in the X-axis direction of the multiple mounting head 121 which is transported along with the beam 122 in the Y-axis direction.

Figure 7:
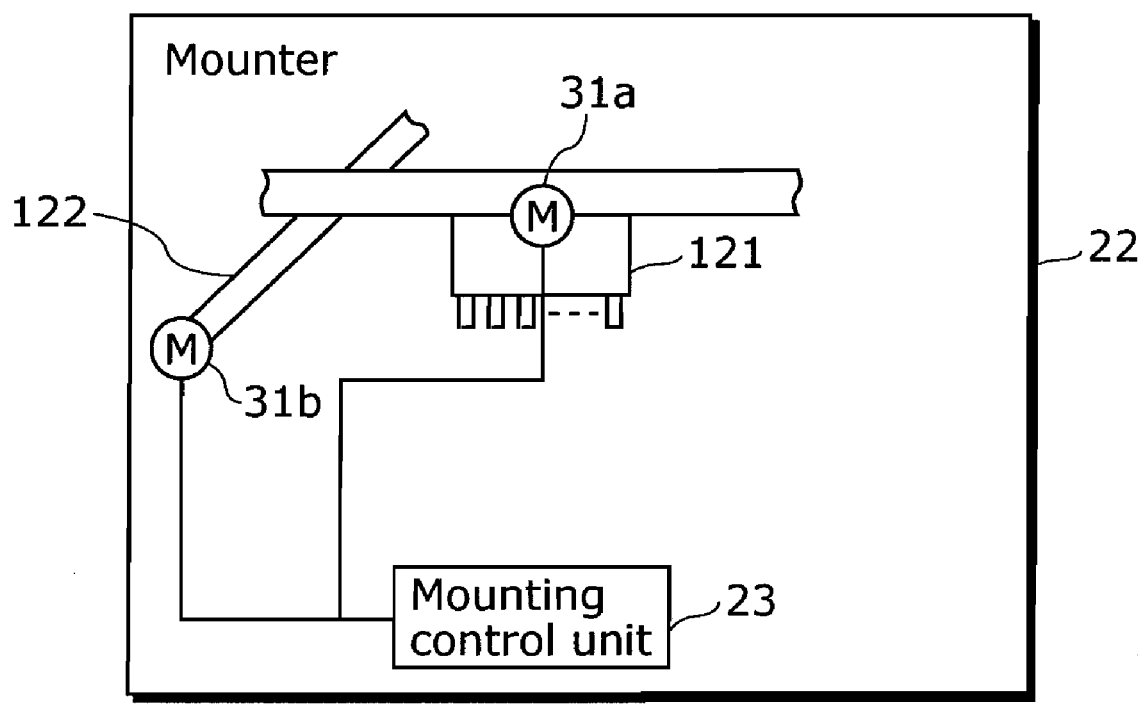
FIG. 7 is a block diagram showing the functional structure of the mounter.

In addition, as shown in FIG. 7, motors 31a and 31b for driving the beam 122 and the multiple mounting head 121 and so on are included in the beam 122 and so on. Furthermore, the mounting control unit 23 controls the transportation speed of the beam 122 and the multiple mounting head 121 by controlling these motors 31a, 31b and so on.

Figure 8:
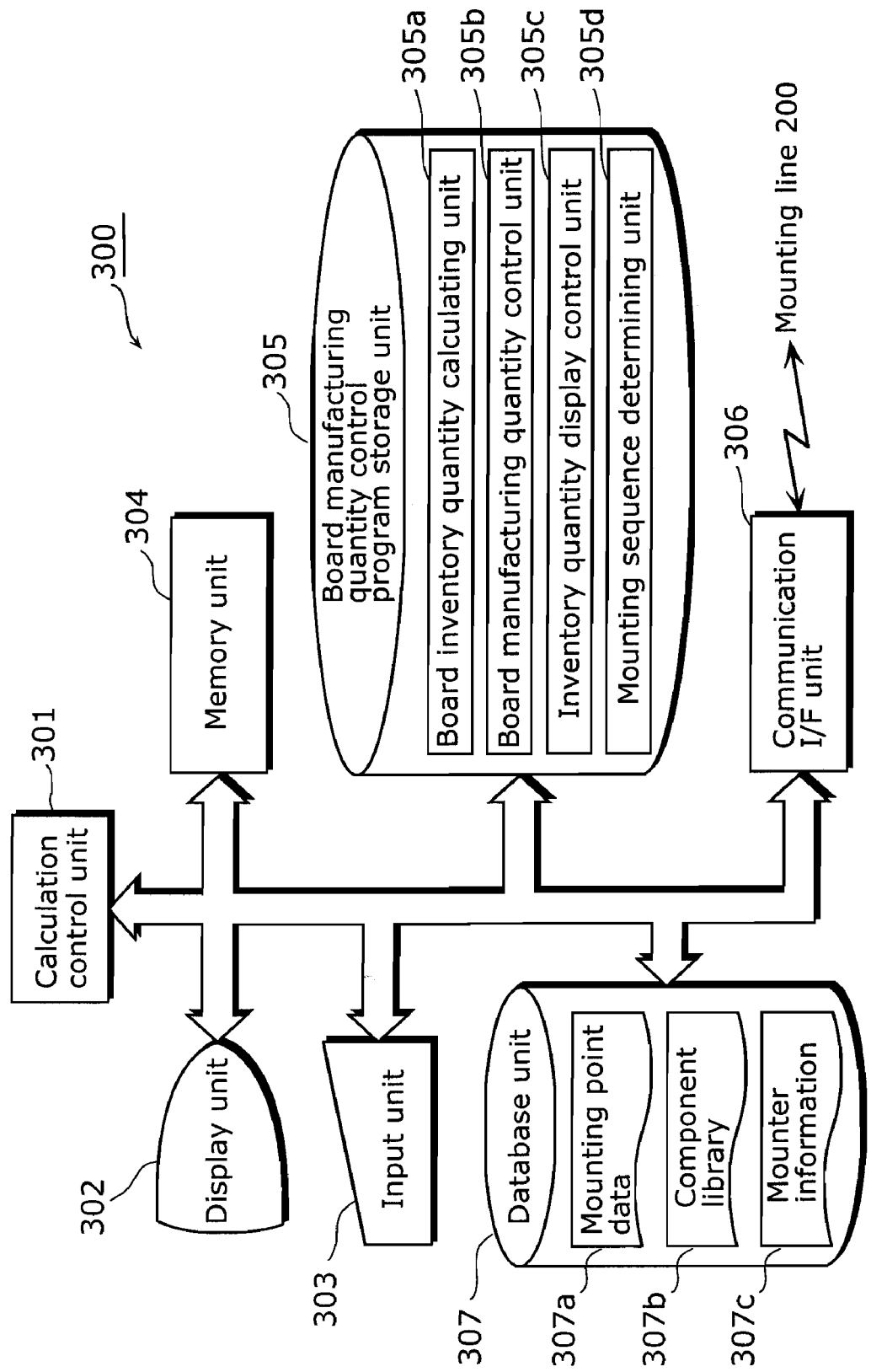
FIG. 8 is a block diagram showing the functional structure of a board manufacturing quantity control apparatus.

FIG. 8 is a block diagram showing the functional structure of the manufacturing management apparatus 300.

The manufacturing management apparatus 300 includes: a calculation control unit 301, a display unit 302, an input unit 303, a memory unit 304, a board manufacturing quantity control program storage unit 305, a communication I/F (Interface) unit 306, and a database unit 307.

The calculation control unit 301, which includes a Central Processing Unit (CPU) and a numeric processor, loads from the board manufacturing quantity control program storage unit 305 and executes a program required for the memory unit 304, and controls each of the constituent elements from 302 to 307 according to the results of the execution.

The display unit 302 has a Cathode-Ray Tube (CRT), a Liquid Crystal Display (LCD) or the like, while the input unit 303 has a keyboard, a mouse or the like. These are used for interaction between the operator and the manufacturing management apparatus 300 under the control of the calculation control unit 301 and so on.

The communication I/F unit 306 such as Local Area Network (LAN) adopters is used for communications between the manufacturing management apparatus 300 and the mounter 22 that is included in the mounting line 200 or the like. The memory unit 304 includes a Random Access Memory (RAM) which offers work area for the calculation control unit 301.

The database unit 307 is, for example, a hard disc on which to record: input data (such as mounting point data 307a, a component library 307b, and mounting information 307c) which are used for a process of creating a mounting program performed by the manufacturing management apparatus 300; and the obtained mounting program and so on.

Figure 9:
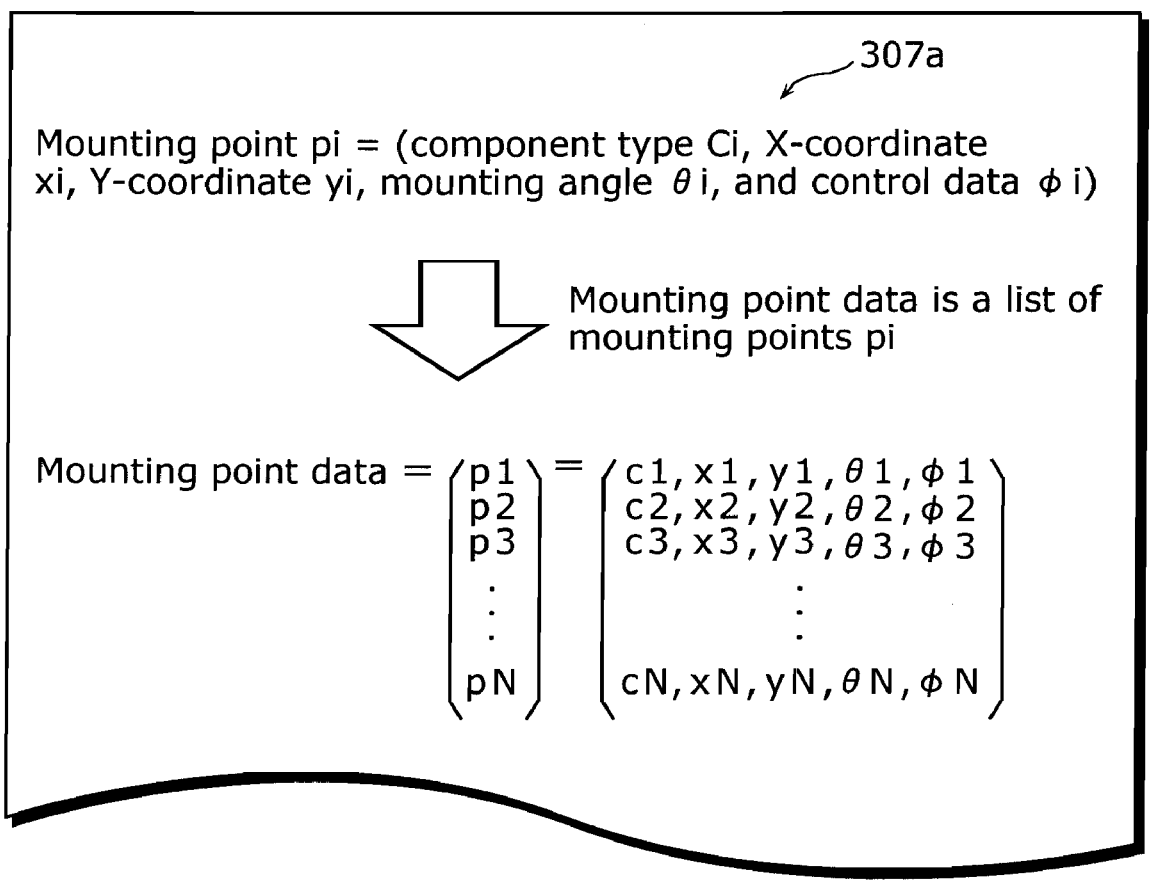
FIG. 9 is a diagram showing an example of mounting point data.
Figure 11:
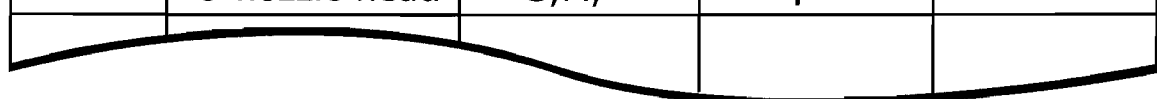
FIG. 11 is a diagram showing an example of mounter information.

FIGS. 9 to 11 are diagrams showing examples of the mounting point data 307a, the component library 307b, and the mounting information 307c, respectively.

The mounting point data 307a are a combination of information which shows a mounting point for each of the components to be mounted. As shown in FIG. 9, a mounting point pi is defined by: a component type ci; an X-coordinate xi; a Y-coordinate yi; a mounting angle θi; and control data φi. Here, the "component type" corresponds to the component name in the component library 307b shown in FIG. 10, while the "X-coordinate" and the "Y-coordinate" are the coordinates of a mounting point (the coordinates showing a specific point on a board). The "mounting angle" is an angle of rotation of a component at the time of mounting, while the "control data" are information indicating restrictions on, for example, the mounting of each component (such as a usable type of pickup nozzle and a maximum transportation speed of the multiple mounting head 121).

The component library 307b is a library which collects specific information about every component type that the mounter 22 can deal with, and, as shown in FIG. 10, includes: a component size of each component type; takt time (the takt time specific to each of the component types under given conditions) and other restriction information (such as a usable type of pickup nozzle, a recognizing method by the component recognizing camera 126, and the maximum speed level for the multiple mounting head 121). Note that the figure also shows an external view of a component of each component type as an example.

The mounter information 307c is information which shows an apparatus structure for every stage included in the manufacturing line and information indicating the above restrictions, and, as shown in FIG. 11, includes: the type of the multiple mounting head 121, that is, head information about the number of pickup nozzles included in the multiple mounting head 121 and so on; nozzle information about the type of pickup nozzle that is attachable to the multiple mounting head 121; feeder information about the maximum number of the component feeders 123; and tray information about the number of tiers and so on that are stored in the tray supply unit 128.

The board manufacturing quantity control program storage unit 305 is, for example, a hard disc on which to record every type of control program for realizing functions of the manufacturing management apparatus 300, and, in terms of functions (as a processing unit which functions at the time of execution by the calculation control unit 301), includes: a board inventory quantity calculating unit 305a; a board manufacturing quantity control unit 305b; an inventory quantity display control unit 305c; and a mounting sequence determining unit 305d.

The board inventory quantity calculating unit 305a is a processing unit which calculates the inventory quantity of boards to be manufactured in the mounting line 200. The board manufacturing quantity control unit 305b is a processing unit which controls the manufacturing quantity of boards in the mounting line 200 so that the inventory quantity will be equal to or smaller than a predetermined optimum inventory quantity. The inventory quantity display control unit 305c is a processing unit which displays a graph showing the inventory quantity in the display unit 302. The mounting sequence determining unit 305d is a processing unit which determines a mounting sequence of components so that the line takt time will be minimized under given mounting conditions.

Next, processes to be performed by the manufacturing management apparatus 300 will be described.

Figure 12:
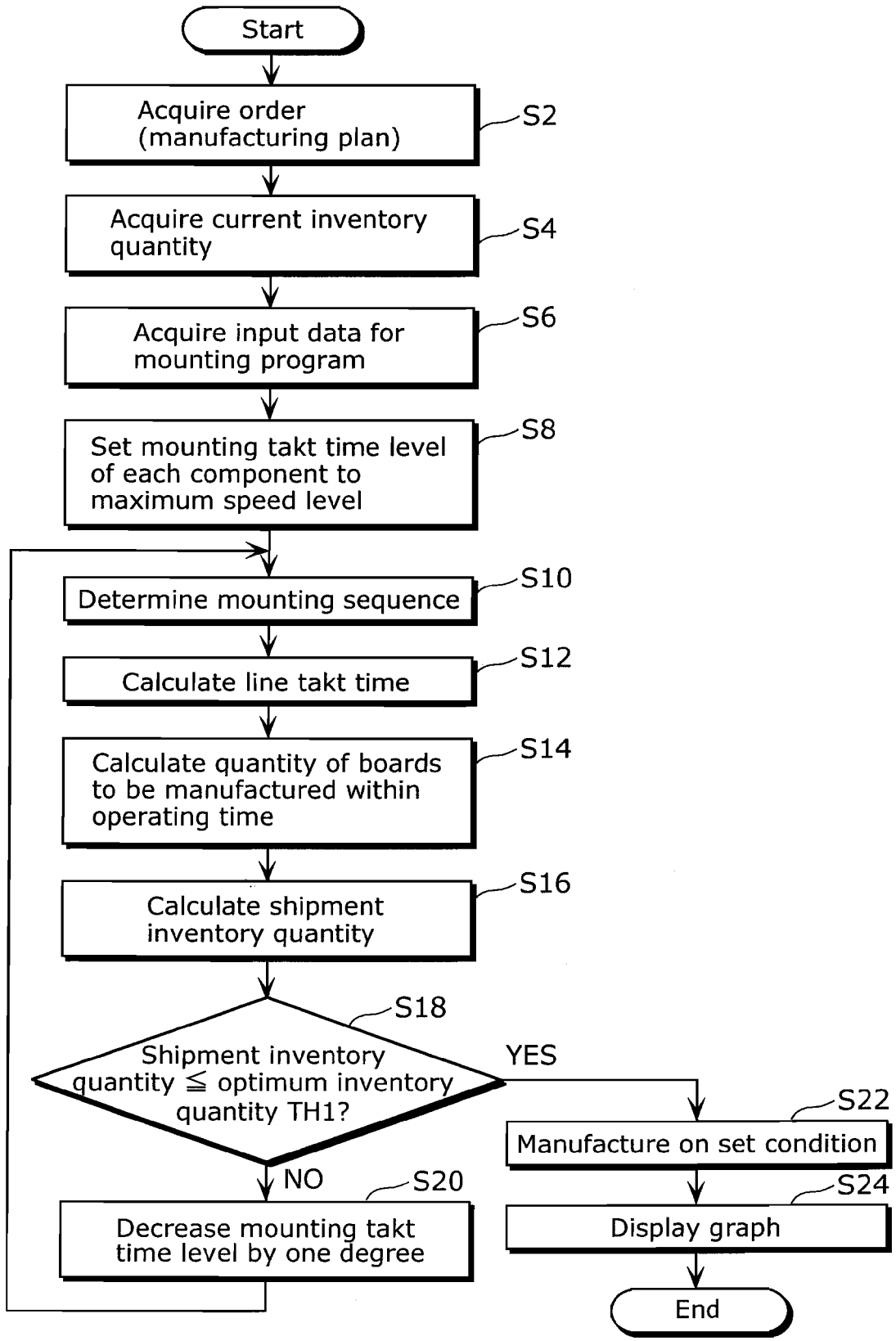
FIG. 12 is a flowchart of processes performed by a board manufacturing quantity control apparatus.

FIG. 12 is a flowchart of the processes to be performed by the manufacturing management apparatus 300.

The board inventory quantity calculating unit 305a acquires an order (a manufacturing plan) that is inputted by an operator using the input unit 303 (S2). For example, as shown in FIG. 1, assume that an order of "manufacture 150 boards A per day" is inputted, and that the board inventory quantity calculating unit 305a acquires the order.

The board inventory quantity calculating unit 305a acquires the current inventory quantity of boards A that are present within the factory prior to manufacturing of boards (S4). For example, assume that the current inventory quantity of boards A is 30 boards.

The mounting sequence determining unit 305d acquires input data (such as the mounting point data 307a, the component library 307b, and the mounter information 307c) for creating a mounting program that are registered in the database unit 307 (S6).

The board manufacturing quantity control unit 305b sets the mounting takt time level, which determines the mounting speed for each component in the mounter 22 or 24, to the maximum level that is set according to each component type in the component library (S8).

The maximum speed level is the level of the transportation speed of the multiple mounting head 121 and categorized into eight levels from 1 to 8 as shown in FIG. 10. The maximum speed level for each component type is determined in the component library. Level 1 is the maximum speed level at which the multiple mounting head 121 can be transported at the highest speed, while level 8 is the maximum speed level at which the multiple mounting head 121 can be transported at the lowest speed. Note that the "maximum" in the term "maximum speed level" is the maximum speed at which a component can be picked up and transported.

In S8, in the case of a component type for which level 4 is set in the component library, its maximum speed level is level 4, and thus the level should be set to level 4.

The mounting sequence determining unit 305d determines the mounting sequence of components to be mounted onto the board 20 based on the input data that are acquired in the input data acquiring process (S6) and the set maximum speed level of the multiple mounting head 121 (S10). For a determining process of the mounting sequence, various kinds of methods have been suggested to date, and since it is not the principal object of the present invention, the detailed description is not repeated here.

The board inventory quantity calculating unit 305a calculates a line takt time for the mounting line 200 based on the result of the determining process (S10) and the mounting takt time level for the multiple mounting head 121 (S12). For example, assume that the takt time per board is calculated to be three minutes.

The board inventory quantity calculating unit 305a calculates the manufacturing quantity of boards within an operating time based on the line takt time (S14). Here, assume that the operating time, by way of example, is a time during which the factory is operating, for example, for eight hours, and the quantity of boards to be manufactured can be calculated by the following Expression (1).

$$\text{Quantity of boards to be manufactured} = \text{operating time/takt time} \qquad (1)$$

As described above, assuming that the takt time is 3 minutes/board and the operating time is eight hours (=480 minutes), assigning these values to Expression (1), the following Expression (2) will be obtained.

$$\text{Quantity of boards to be manufactured} = 480/3 = 160 \qquad (2)$$

Thus, the quantity of boards to be manufactured during the operating time (8 hours) is calculated to be 160 boards.

The board inventory quantity calculating unit 305a calculates the shipment inventory quantity after a lapse of operating time according to the following Expression (3) (S16).

$$\text{Shipment inventory} = \text{quantity of boards to be manufactured} + \text{current inventory quantity} - \text{order quantity} \quad (3)$$

Assigning the above values to Expression (3), the shipment inventory quantity will be obtained by the following Expression (4).

$$\text{Shipment inventory quantity} = 160 + 30 - 150 = 40 \quad (4)$$

Thus, the shipment inventory quantity after a lapse of operating time is calculated to be 40 boards.

The board manufacturing quantity control unit 305b checks whether or not the shipment inventory quantity is within a predetermined range of optimum inventory quantity TH 1 (S18). In the case where the shipment inventory quantity is equal to or smaller than the optimum inventory quantity TH 1 (YES in S18), the board manufacturing quantity control unit 305b starts board manufacturing while keeping the currently set manufacturing condition including the mounting takt time level (S22). In addition, the inventory quantity display control unit 305c causes the display unit 302 to show a graph indicating the temporal transition of the shipment inventory quantity of boards (S24).

Figure 13:
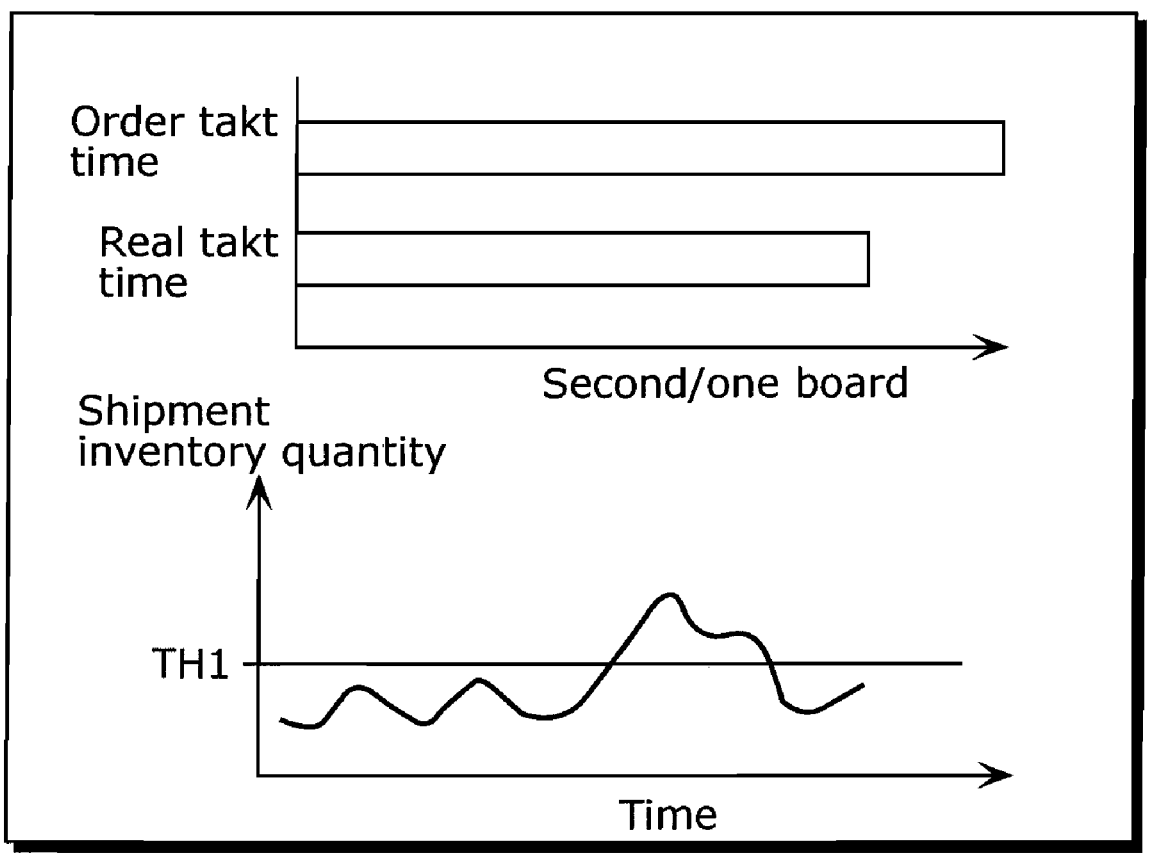
FIG. 13 is a diagram showing an example of a displayed graph.

FIG. 13 is a diagram showing an example of a displayed graph. In the upper part of the graph, an order takt time and a real takt time are shown by comparison. The order takt time is a value calculated by dividing operating time by the quantity of order, while the real takt time is a value calculated in the takt time calculating process (S12) as described above. In the lower part of the graph, a graph showing the temporal transition of the shipment inventory quantity is displayed with the optimum inventory quantity TH1 indicated in the graph. Thus, it is possible to tell at a glance whether or not the shipment inventory quantity exceeds the optimum inventory quantity TH1.

In the case where the shipment inventory quantity is equal to or larger than the optimum inventory quantity TH1 (NO in S18), the board manufacturing quantity control unit 305b lowers the mounting takt time level for the mounter 22 or 24 by one level (S20); that is, lowering the transportation speed of the multiple mounting head 121 by one level. Subsequently, the processes after the mounting sequence determining process (S10) are executed. For example, when the optimum inventory quantity TH1 is 30 boards, the condition of S18 is not satisfied since the shipment inventory quantity calculated earlier is 40 boards. Therefore, the board manufacturing quantity control unit 305b lowers the mounting takt time level by one level (S20). This increases the line takt time resulting in a decrease in the quantity of boards to be manufactured during the operating time. Accordingly, the shipment inventory quantity decreases, and eventually the manufacturing start process (S22) and the graph display process (S24) are executed.

For methods of lowering the mounting takt time level, for example, it is possible to give examples of: a method of lowering the speed for each of the components in a uniform manner; a method of selecting a specific component and lowering the speed; and lowering only the level for the component with the maximum speed level (for example, the level one).

As described above, by the manufacturing system 10 according to the first embodiment, the shipment inventory quantity is determined as changing the mounting condition such as the transportation speed of the multiple mounting head so that the shipment inventory quantity will be equal to or smaller than the optimum inventory quantity. This makes it possible to reduce the shipment inventory quantity as much as possible, and to reduce cost losses resulting from shipment inventory.

In addition, by lowering the mounting takt time level, it is possible to reduce the power consumption of the drive motors.

In addition, the temporal transition of the shipment inventory quantity is displayed as a graph. This enables an operator to tell at a glance whether or not the shipment inventory quantity is optimum.

In addition, a case of the line has been described above as an embodiment. However, the above description has only illustrated one of the embodiments of the present invention, and the present invention is not limited to this embodiment. Therefore, in the present invention, the manufacturing quantity may be controlled for a single mounter so that the inventory quantity for the mounter will be within the optimum inventory quantity.

Note that a mounting condition is determined in the above embodiment, and that the determination also includes optimization in which an optimum mounting condition is determined. Alternately, a mounting condition includes a mounting sequence, and the determination of the mounting sequence for shortening the mounting time is also included in the determination of the mounting condition.

In addition, in the above embodiment, an example has been shown for lowering the mounting takt time level, but the present invention is not limited to this. For example, in the case of a mounter or a manufacturing line which includes plural stages, the shipment quantity may be adjusted to be equal to or smaller than the optimum inventory quantity, and power consumption may also be reduced, by stopping any of the beams included in the stages (stopping power supplies). Moreover, in the case of the multiple mounting head including plural pickup nozzles, the use of part of the pickup nozzles may be stopped. For example, in the case where the pickup nozzles are arranged in two rows, the shipment quantity may be adjusted to be equal to or smaller than the optimum inventory quantity, and power consumption may also be reduced, by not using one of the rows. Here, the reason why power consumption is reduced by partially stopping the use of the pickup nozzles is that the use of pickup nozzles is stopped by closing the valve of the vacuum systems connected to the respective pickup nozzles, and thus the leakage from the pickup nozzles decreases reducing the load on the vacuum pump.

Second Embodiment

In a second embodiment of the present invention, a board manufacturing system which can reduce cost losses resulting from process inventory will be described. However, any description common to the first embodiment will be omitted accordingly.

Figure 14:
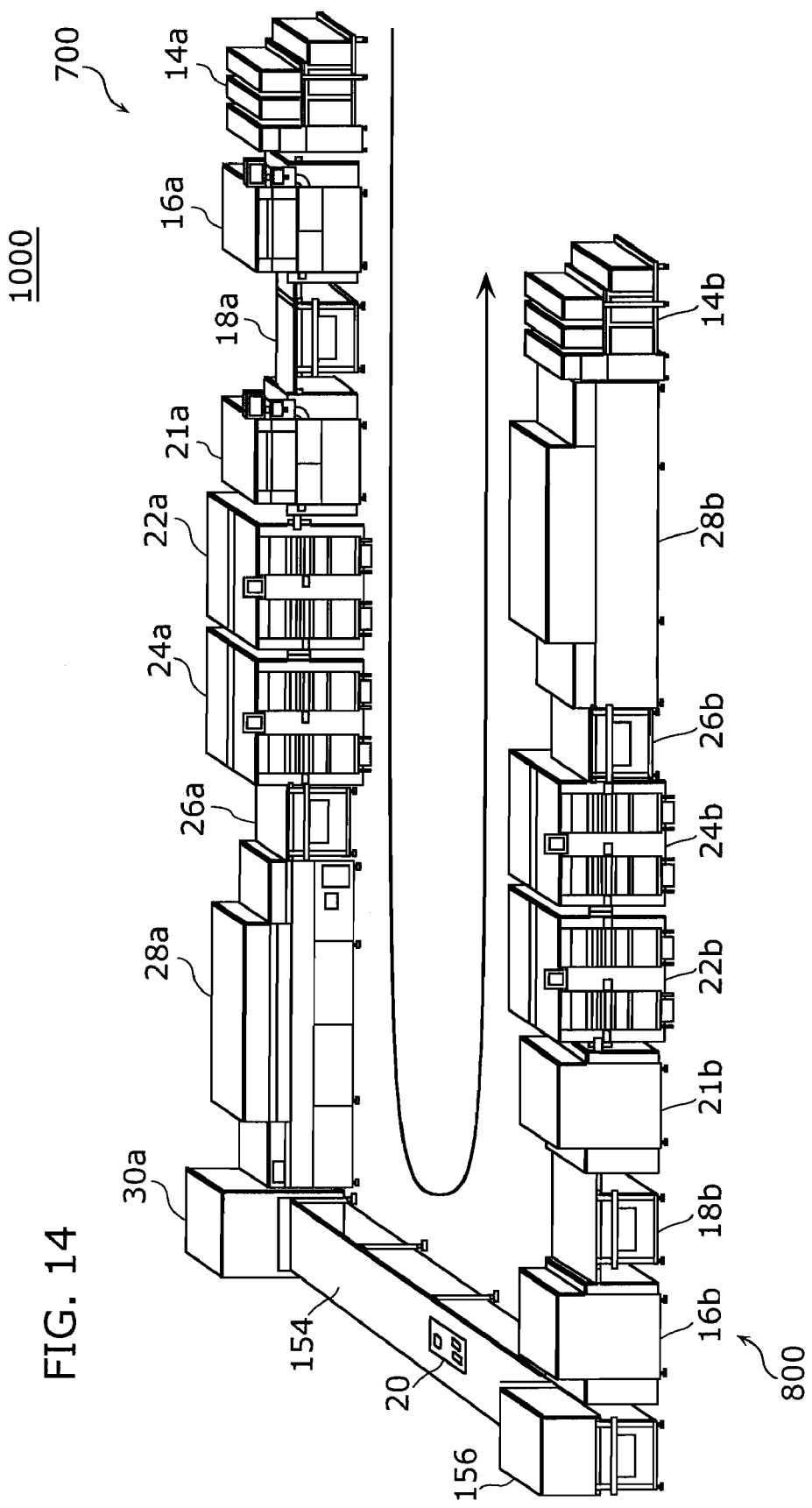
FIG. 14 is an external view, as looked down diagonally from above, of a board manufacturing system according to a second embodiment of the present invention.
Figure 15:
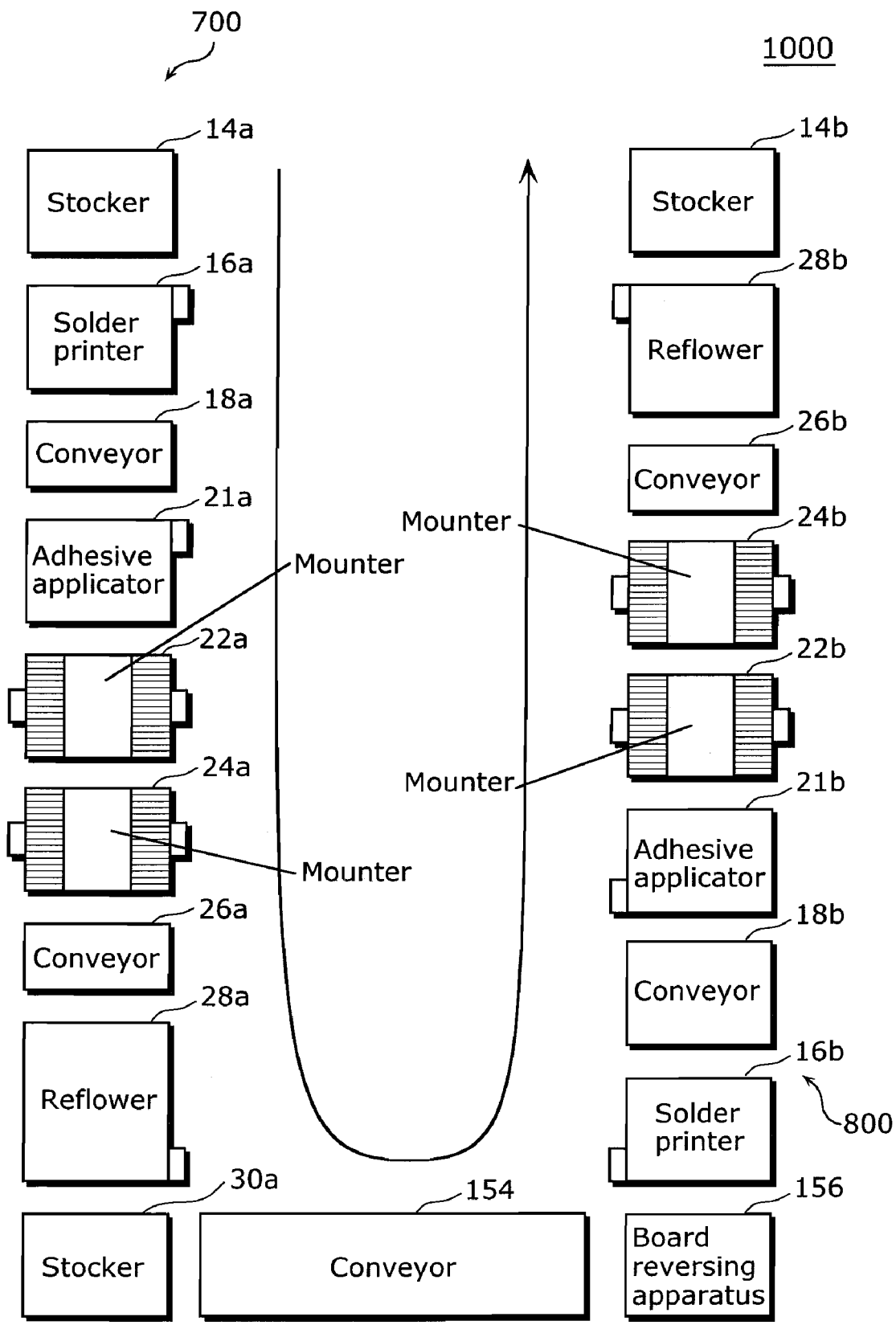
FIG. 15 is a schematic diagram of the manufacturing system shown in FIG. 14 as looked down from above.

FIG. 14 is an external view of the board manufacturing system according to the second embodiment of the present invention as looked down from above. FIG. 15 is a schematic diagram of the manufacturing system shown in FIG. 14.

The manufacturing system 1000 is a system for manufacturing a mounted board that is a board mounted with components, and includes: a back surface mounting line 700, a stocker 30a, a conveyer 154, a board reversing apparatus 156, a front surface mounting line 800, and a manufacturing management apparatus 300 (not shown). The board flows in sequence in the direction indicated by arrows in FIG. 14 and FIG. 15.

The back surface mounting line 700 is a mounting line which mounts components onto the back surface of the board and includes from the upstream side: a stocker 14a, a solder printer 16a, a conveyor 18a, an adhesive applicator 21a, a mounter 22a, a mounter 24a, a conveyor 26a, and a reflower 28a.

The front surface mounting line 800 is a mounting line which mounts components onto the front surface of the board, and includes, from the upstream side: a solder printer 16b, a conveyor 18b, an adhesive applicator 21b, a mounter 22b, a mounter 24b, a conveyor 26b, a reflower 28b, and a stocker 14b.

The stockers 14a, 30a, and 14b are apparatuses for stocking boards. The stocker 14a is located in the uppermost stream of the back surface mounting line 700, while the stocker 30a is located in the downmost stream of the back surface mounting line 700, and the stocker 14b is located in the downmost stream of the front surface mounting line 800.

In other words, a board which is not yet mounted with a component is stocked with the back surface up in the stocker 14a, while a board only the back surface of which is mounted with components is stocked in the stocker 30a, and a board both sides of which are mounted with components is stocked in the stocker 14b The solder printers 16a and 16b are apparatuses for printing solders on the board.

The conveyors 18a, 26a, 154, 18b, and 26b are apparatuses for transporting the board. The adhesive applicator 21a and 21b are apparatuses for applying adhesive to the board.

The reflowers 28a and 28b are apparatuses for fixing components onto the board after melting the solders or the like by heating the board 20 mounted with the components.

The board reversing apparatus 156 reverses each board that is transported from the conveyor 154.

The mounters 22a, 24a, 22b, and 24b have the same structure as the mounters 22 and 24 shown in the first embodiment.

The manufacturing management apparatus 300 is a computer for controlling the quantity of boards to be manufactured in the respective manufacturing apparatuses included in the back surface mounting line 700 and the front surface mounting line 800, and the structure is the same as described in the first embodiment.

Figure 16:
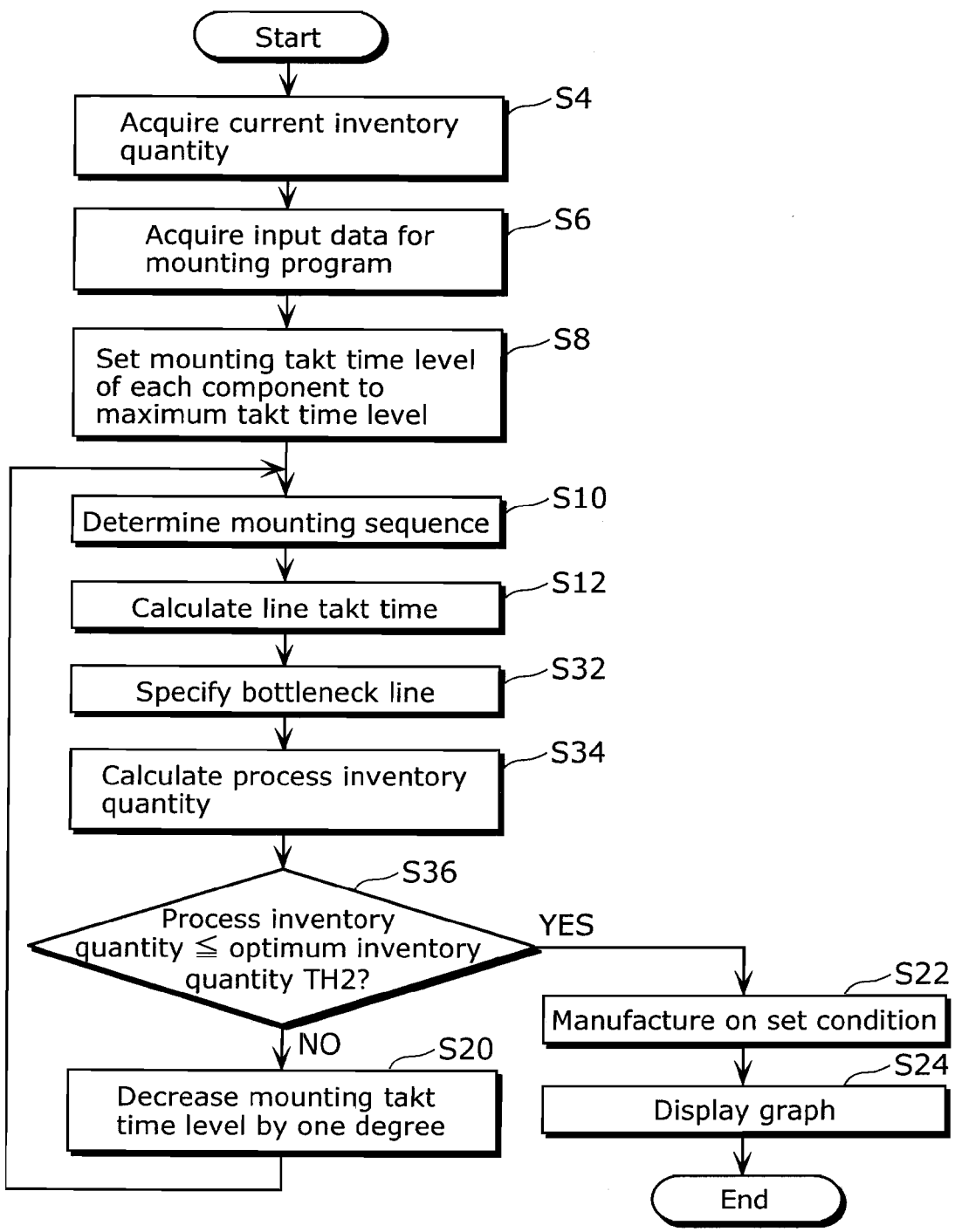
FIG. 16 is a flowchart of processes performed by a board manufacturing quantity control apparatus.

Next, processes to be performed by the manufacturing management apparatus 300 will be described. FIG. 16 is a flowchart of the processes to be performed by the manufacturing management apparatus 300.

In the manufacturing system 1000, processes of: acquiring the current quantity of boards to be manufactured (S4); acquiring input data for creating a mounting program (S6); setting the mounting takt time level, which provides the mounting speed level of each component in mounters 22a, 24a, 22b, and 24b, to the maximum speed level (S8); determining a mounting sequence for components to be mounted onto the board (S10); and calculating the line takt time (S12) are the same as in the first embodiment.

Note that in the line takt time calculating process (S12), the line takt time for the back surface mounting line 700 and the line takt time for the front surface mounting line 800 are calculated. For example, the line takt time for the back surface mounting line 700 is 12 seconds, while the line takt time for the front surface mounting line 800 is 20 seconds.

The board inventory quantity calculating unit 305a specifies a bottleneck line from among plural mounting lines (S32). The bottleneck line is a line that has the largest takt time among plural mounting lines. In other words, in the case where two kinds of lines; that is, the back surface mounting line 700 and the front surface mounting line 800, are used, the front surface mounting line 800 is specified as the bottleneck line.

The board inventory quantity calculating unit 305a calculates the process inventory quantity of the current mounting line other than the bottleneck line according to the following Expression (5) (S34).

Process inventory quantity=current inventory quantity+operating time/line takt time for the current mounting line−operating time/line takt time for the bottleneck line (5)

Here, by way of example, assuming that the current inventory quantity is 10 boards and that the operating time is one hour (=3600 seconds), the process inventory quantity will be as Expression (6).

Process inventory quantity=10+3600/12−3600/20=130 (6)

Thus, the process inventory quantity of boards after a lapse of operating time is calculated to be 130 boards. Accordingly, when mounted-board manufacturing is started under the current conditions, 130 boards of which only the back surface is mounted with components are stored in the stocker 30a as process inventory after the lapse of operation time.

The board manufacturing quantity control unit 305b checks whether or not the process inventory quantity is within a predetermined range of optimum inventory quantity TH2 (S36). In the case where the process inventory quantity is equal to or smaller than the predetermined optimum inventory quantity TH2 (YES in S36), the board manufacturing quantity control unit 305b starts board manufacturing while keeping the current predetermined manufacturing conditions including the mounting takt time level (S22). In addition, the inventory quantity display control unit 305c causes a display unit 302 to show a graph which indicates the temporal transition of the process inventory quantity of boards (S24).

Figure 17:
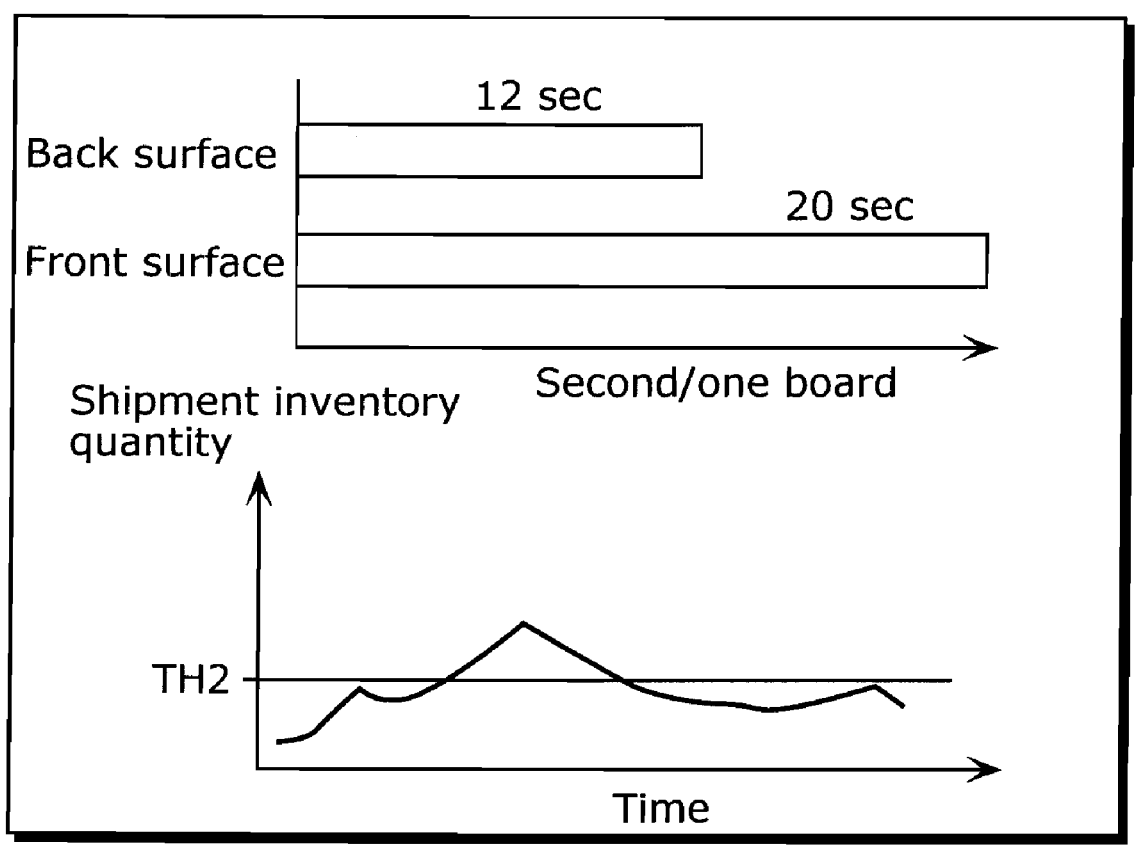
FIG. 17 is a diagram showing an example of a displayed graph.

FIG. 17 is a diagram showing an example of a displayed graph. In the upper part of the graph, the takt time for the back surface mounting line 700 and the takt time for the front surface mounting line 800 are shown by comparison. In the lower part of the graph, the temporal transition of the process inventory quantity is displayed with an optimum inventory quantity TH2 indicated in the graph. Thus, it is possible to tell at a glance whether or not the process inventory quantity exceeds the optimum inventory quantity TH2.

In the case where the process inventory quantity is equal to or larger than the optimum inventory quantity TH2 (NO in S36), the board manufacturing quantity control unit 305b lowers the mounting takt time level for the mounter 22a or 24a by one level (S20). The process of lowering the mounting takt time level (S20) is the same as described in the first embodiment. After this, the processes after the mounting sequence determining process (S10) are performed. For example, when the optimum inventory quantity TH2 is 20 boards, the condition of S36 is not satisfied since the process inventory quantity calculated earlier is 130 boards. Thus, the board manufacturing quantity control unit 305b lowers the mounting takt time level by degrees until the process inventory quantity becomes equal to or smaller than TH2. Note that according to Expression (5), in the case where the line takt time for the current mounting line is equal to the line takt time for the bottleneck line, the process inventory quantity and the current inventory quantity become equal.

As described above, in the manufacturing system 1000 according to the second embodiment, mounting conditions such as the transportation speed of the multiple mounting head are determined as varied so that the process inventory quantity will be equal to or smaller than the optimum inventory quantity. This makes it possible to reduce the process inventory quantity as much as possible and to reduce cost loss resulting from process inventory.

In addition, the temporal transition of the process inventory quantity is displayed as a graph. This enables an operator to tell at a glance whether or not the shipment inventory quantity is optimum.

Note that in S20 of FIG. 16 the mounting takt time level for the current line is lowered, but without being limited to this, part of the components to be mounted on the bottleneck line may be diverted to the current line so that the process inventory quantity will be equal to or smaller than the optimum inventory quantity.

Third Embodiment

In a third embodiment of the present invention, a board manufacturing system for reducing cost losses resulting from shipment inventory will be described. Note that any description common to the above first and second embodiments will be omitted accordingly.

In the structure of a board manufacturing system according to the third embodiment of the present invention, a board inventory quantity simulation apparatus is used in place of the manufacturing management apparatus 300 in the structure of the manufacturing system shown in the first embodiment.

Figure 18:
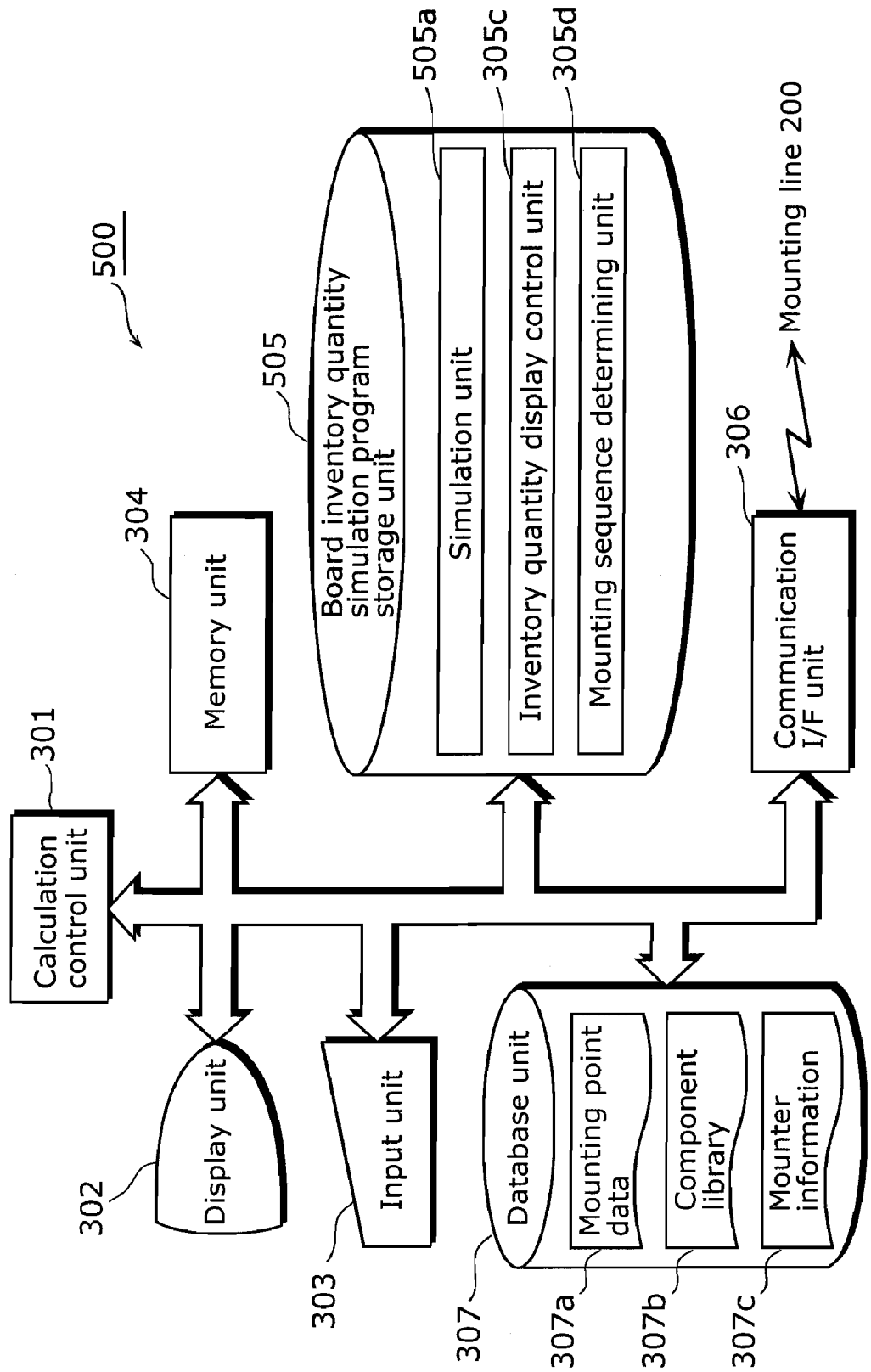
FIG. 18 is a block diagram showing the functional structure of a board inventory quantity simulation apparatus.

FIG. 18 is a block diagram showing the functional structure of the board inventory quantity simulation apparatus.

The board inventory quantity simulation apparatus 500 uses a board inventory quantity simulation program storage unit 505 in place of the board manufacturing quantity control program storage unit 305 in the structure of the manufacturing management apparatus 300 shown in FIG. 8. Since the other processing units are the same as those shown in FIG. 8, the detailed description will not be repeated here.

The board inventory quantity simulation program storage unit 505 is, for example, a hard disc on which to record every type of program to realize the functions of the board inventory quantity simulation apparatus 500 and, in terms of functions (as a processing unit which functions at the time when executed by the calculation control unit 301), includes a simulation unit 505a, a board quantity display control unit 305c, and a mounting sequence determining unit 305d.

The inventory quantity display control unit 305c and the mounting sequence determining unit 305d are the same processing units as described in the first embodiment.

The simulation unit 505a is a processing unit which simulates the shipment quantity of boards based on the manufacturing condition for the mounting line 200.

Figure 19:
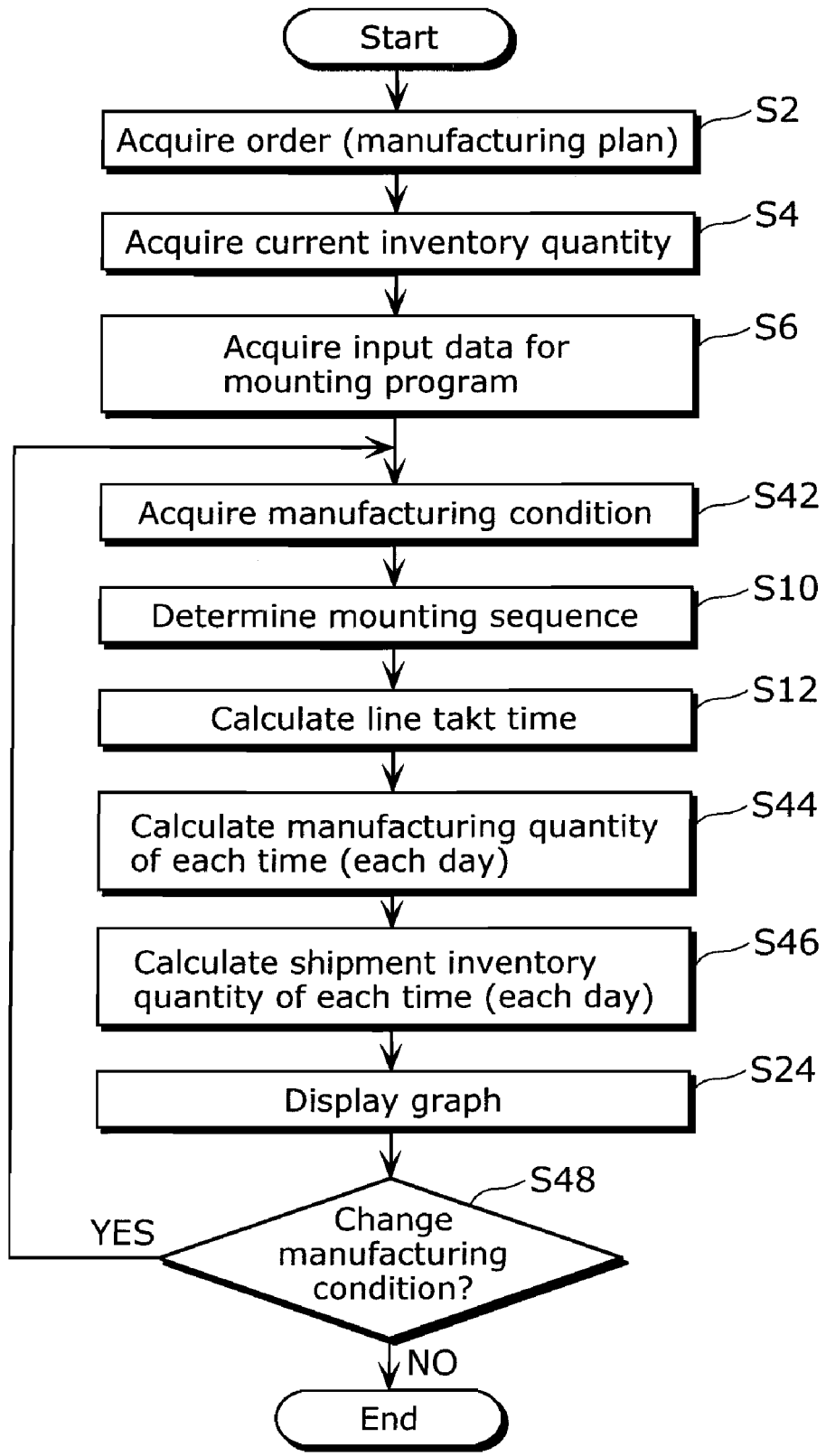
FIG. 19 is a flowchart of processes performed by the board inventory quantity simulation apparatus.

Next, processes to be performed by the board inventory quantity simulation apparatus 500 will be described. FIG. 19 is a flowchart of the processes to be performed by the board inventory quantity simulation apparatus 500.

The simulation unit 505a performs a process of acquiring an order (S2) and a process of acquiring the current inventory quantity (S4). These processes are the same as the processes to be performed by the manufacturing management apparatus 300 shown in the first embodiment.

Next, the mounting sequence determining unit 305a performs a process of acquiring input data for creating a mounting program (S6). This process is the same as described in the first embodiment.

The simulation unit 505a acquires a manufacturing condition for the mounting takt time level that is predetermined as the initial manufacturing condition in a component library (S42). Here, by way of example for a manufacturing condition, the simulation unit 505a acquires, from the component library, the mounting takt time level for the multiple mounting head 121 shown in the first embodiment.

Next, the mounting sequence determining unit 305d performs a process of determining a mounting sequence for components to be mounted onto a board (S10). In this process, any of various kinds of already known methods is used as described in the first embodiment.

The simulation unit 505a performs a line takt time calculating process (S12). The process is the same as described in the first embodiment.

The simulation unit 505a calculates the quantity of boards to be manufactured in every predetermined time (for example, every five minutes) (S44). This process is the same as the line takt time calculating process (S12) and the manufacturing quantity calculating process (S14) in the first embodiment.

The simulation unit 505a calculates the shipment inventory quantity in every predetermined time as described above (S46). Note that this process is the same as the shipment inventory quantity calculating process (S16) in the first embodiment.

The inventory quantity display control unit 305c causes the display unit 302 to display a graph which indicates the temporal transition of the shipment inventory quantity of boards (S24). This process is the same as described in the first embodiment. In other words, the inventory quantity display control unit 305c causes the display unit 302 to display such a graph as shown in FIG. 13. In this manner, the shipment inventory quantity of every predetermined time is displayed.

Note that when an operator wants to change the manufacturing condition, for example, in the case where the shipment inventory quantity exceeds the optimum inventory quantity in the simulation results displayed in S24 and where it is required to change the manufacturing condition so that the shipment inventory quantity will be within the optimum inventory quantity (YES in S48), the simulation unit 505a acquires the manufacturing condition (S42), and the processes after the mounting sequence determining process (S10) are repeated by an operator inputting the manufacturing condition again with the use of the input unit 303.

As described above, according to the system related to the third embodiment, the operator can simulate the shipment inventory by changing the conditions for the mounting line in various ways. Accordingly, the operator can find out the optimum manufacturing conditions for reducing cost losses resulting from shipment inventory.

Fourth Embodiment

In a fourth embodiment of the present invention, a board manufacturing system for reducing cost losses resulting from process inventory will be described. However, any description common among the above first to the third embodiments will be omitted accordingly.

For the structure of the board manufacturing system according to the fourth embodiment of the present invention, a board inventory quantity simulation apparatus is used in place of the manufacturing management apparatus 300 in the structure of the manufacturing system shown in the second embodiment.

The board inventory quantity simulation apparatus is a computer for controlling the quantity of boards to be manufactured in each manufacturing equipment included in a back surface mounting line 700 and a front surface mounting line 800, and the structure is the same as described in the third embodiment.

Figure 20:
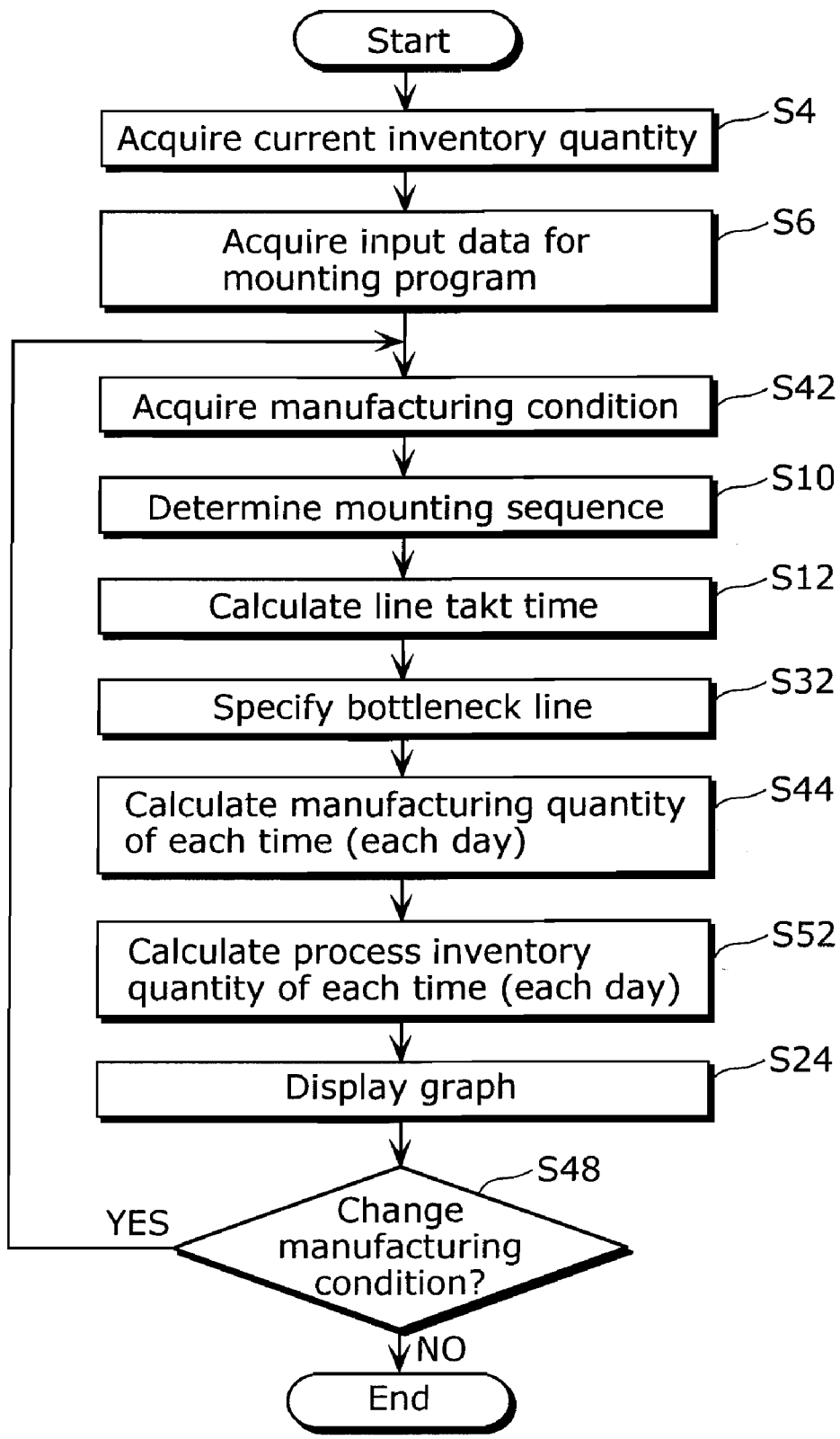
FIG. 20 is a flowchart of processes performed by the board inventory quantity simulation apparatus.

Next, the processes to be performed by the board inventory quantity simulation apparatus 500 will be described. FIG. 20 is a flowchart of the processes to be performed by the board inventory quantity simulation apparatus 500.

The processes from the current inventory quantity acquiring process (S4) to the line takt time calculating process (S12) are the same as described in the third embodiment.

The bottleneck line specifying process (S32) is the same process as described in the second embodiment.

The manufacturing quantity calculating process (S44) is the same process as described in the third embodiment.

Next, the simulation unit 505*a* calculates the process inventory quantity for each predetermined time (for example, every five minutes) which is used in a manufacturing quantity calculating process (S44) (S52). Note that this process is the same as the process inventory quantity calculating process (S34) in the second embodiment.

An inventory quantity display control unit 305*c* causes a display unit 302 to display a graph which indicates the temporal transition of the process inventory quantity of boards (S24). This process is the same as described in the second embodiment. In other words, the inventory quantity display control unit 305*c* causes the display unit 302 to display such a graph as shown in FIG. 17. Thus, the process inventory quantity for every predetermined time is displayed.

The manufacturing condition change judging process (S48) is the same as the third embodiment.

As described above, the manufacturing system according to the fourth embodiment allows an operator to simulate the process inventory while changing the manufacturing conditions of the mounting line in various ways. This enables an operator to find out optimum manufacturing conditions for reducing the cost losses resulting from process inventory.

As for changing the manufacturing condition, for example, note that part of the components to be mounted on the bottleneck line may be diverted to the current line so that the process inventory quantity will be equal to or smaller than the optimum inventory quantity.

Although the manufacturing systems according to the embodiments of the present invention have been described above, the present invention is not limited to these embodiments.

For example, in the first to fourth embodiments, the process inventory quantity is adjusted by changing the transportation speed of the multiple mounting head, but the process inventory quantity may be adjusted by changing the number of mounters to be used for mounting. For example, in the case where the mounting line has five mounters, and where excessive inventory is generated by using all of the five mounters, four mounters may be caused to operate and one mounter to perform only the operation of passing each board without performing any mounting operation.

In addition, the mounter used in the first to fourth embodiments is known as a "multi-function mounter," which mounts each component onto a board by transporting the multiple mounting head as described with reference to FIG. 5 and FIG. 6. However, the mounter is not limited to such a multi-function mounter, and a mounter known as a "high-speed mounter" may be used.

Hereinafter, the high-speed mounter will be described.

Figure 21:
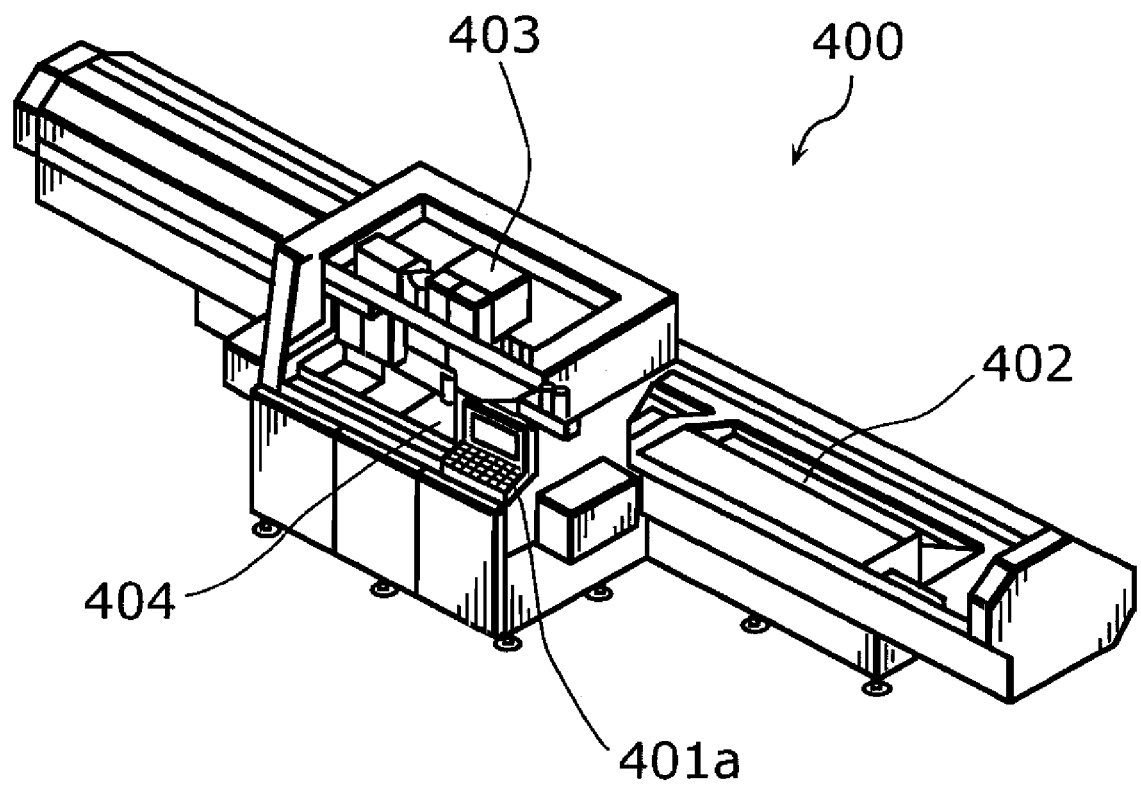
FIG. 21 is an external view of a mounter known as a high-speed mounter as seen diagonally from front.

FIG. 21 is an external view of a mounter known as a "high-speed mounter" as seen diagonally from the front.

The mounter 400 is a mounting apparatus which mounts plural types of components at high speed onto a printed board which is to be included in an electronic device. The mounter includes: a rotary head 403 which picks up, transports, and mounts components; a component supply unit 402 which supplies many types of components to the rotary head 403; and an X-Y table 404 which transports the placed printed board in the horizontal direction.

Figure 22:
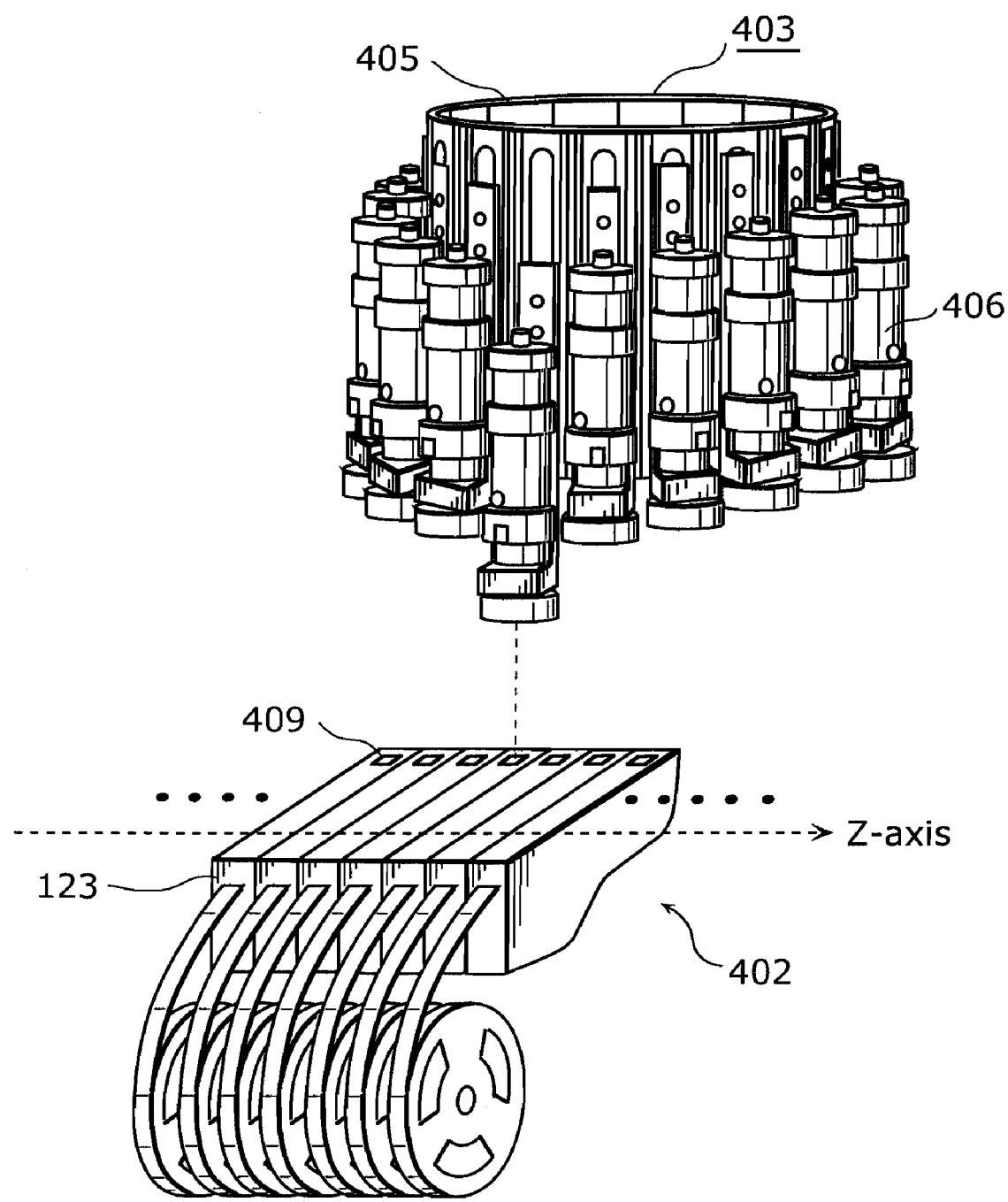
FIG. 22 is a schematic diagram showing the positional relationship between a component supply unit and a rotary head.

FIG. 22 is a schematic diagram showing the positional relationship between the component supply unit and the rotary head.

The rotary head 403, as shown in the upper part of FIG. 22, includes eighteen mounting heads 406 as mounting units components on printed boards. In addition, each mounting head 406, attachable with mobility in the height direction to a rotary base 405 which rotates without moving in the height direction, includes six pickup nozzles (not shown) which can hold components by vacuum pickup.

In the component supply unit 402, as shown in the lower part of FIG. 22, component feeders 123 capable of sequentially supplying identical components to the mounting head 406 are arranged in a row. In addition, the component supply unit 402 has a function to select the components to be mounted by mobile positioning of the component supply unit 402 with respect to the rotary head 403 in the Z-axis direction as shown in FIG. 22.

Figure 23:
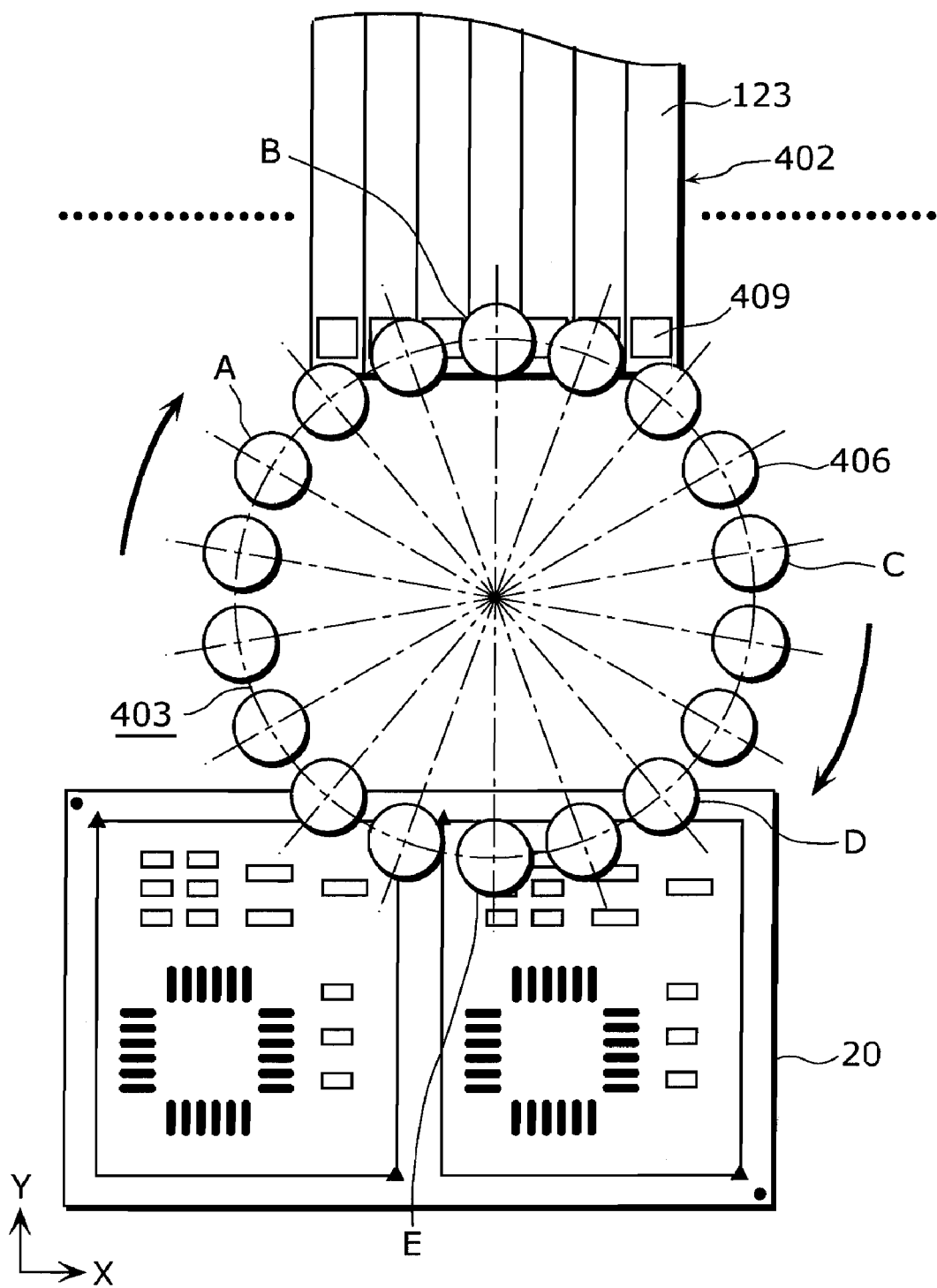
FIG. 23 is a diagram showing the positional relationship between the rotary head, a board, and the component supply unit.

FIG. 23 is a schematic diagram showing the positional relationships between the rotary head, the board, and the component supply unit.

As shown in the figure, the rotation axis of the rotary head 403 does not move, but the mounting head 406 which is provided around the rotary head 403 operates in accordance with each position by intermittently rotating around the rotation axis. To describe this simply, the mounting head 406, which is located above a pickup opening 409 (position B) included in each component feeder 123, picks up a component through the pickup opening 409, and mounts the picked-up component onto the board 20 when the mounting head 406 is located in the opposite position E.

Note that the board 20 onto which the component is to be mounted is placed on an X-Y table (not shown) which is movable in the horizontal direction, and the position at which the component should be mounted is determined by transporting the board 20.

In such a mounter known as a high-speed mounter, inventory quantity may be adjusted by changing the rotation speed of the rotary head. In addition, inventory quantity may be adjusted by changing the transportation speed of the X-Y table. Additionally, inventory quantity may be adjusted by changing the transportation speed of the component supply unit.

In addition, the optimum inventory quantity may be determined based on the cost required for keeping the inventory quantity of boards. For example, assuming the inventory cost plus board and component price costs to be the initial cost, the upper limit of the inventory cost may be determined in terms of profitability, and the optimum inventory may be determined based on the determined upper limit of the inventory cost. In addition, the above-mentioned initial cost may be assumed to include electricity charges in addition to the inventory cost, and the board and component costs.

Furthermore, in the manufacturing management apparatus 300 or the board inventory quantity simulation apparatus 500 according to the first to fourth embodiments, each type of data is acquired based on the data input by an operator (for example, an order acquiring process (S2)). However, the operator should not necessarily input data, but may also cause a memory device such as a database unit 307 to record the necessary data in advance and to acquire each type of data from there.

Furthermore, the mounter may have the functions of the manufacturing management apparatus or the board inventory quantity simulation apparatus.

In addition, the above operating time or predetermined time may be specified by the hour or by the date.

Fifth Embodiment

Hereinafter, a manufacturing management apparatus according to a fifth embodiment will be described with reference to the drawings.

Figure 24:
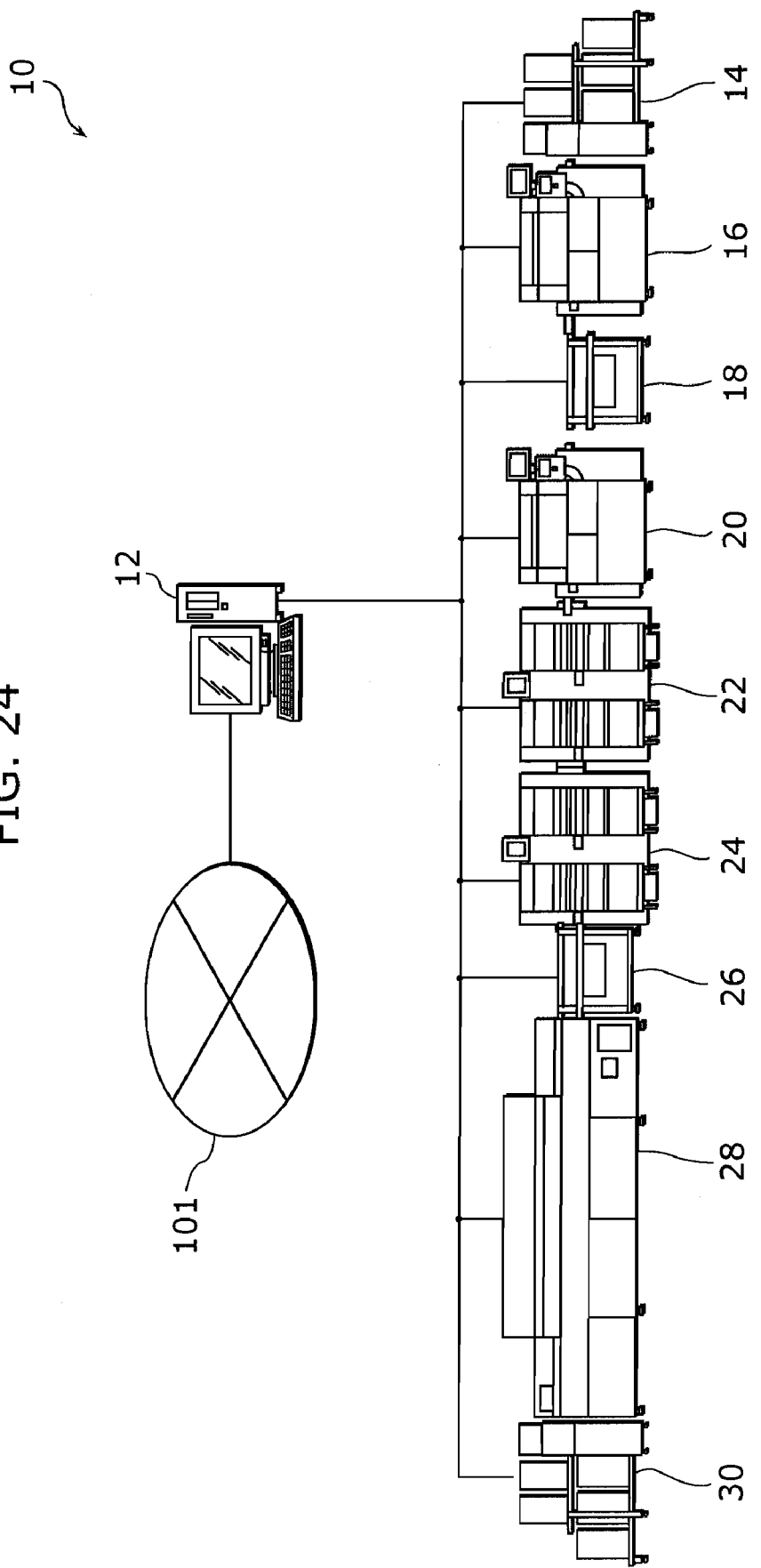
FIG. 24 is an external view showing the structure of a manufacturing line managed by a manufacturing management apparatus according to this embodiment.

FIG. 24 is an external view showing the structure of a manufacturing line managed by the manufacturing management apparatus according to this embodiment.

The manufacturing system 10 is a manufacturing line which manufactures a mounted board mounted with components on the manufacturing line by transporting the board in sequence from upstream manufacturing equipment to downstream manufacturing equipment, and includes, as manufacturing apparatuses with respective roles: stockers 14 and 30, a solder printer 16, conveyers 18 and 26, an adhesive applicator 21, mounters 22 and 24, and a reflower 28.

Figure 27:
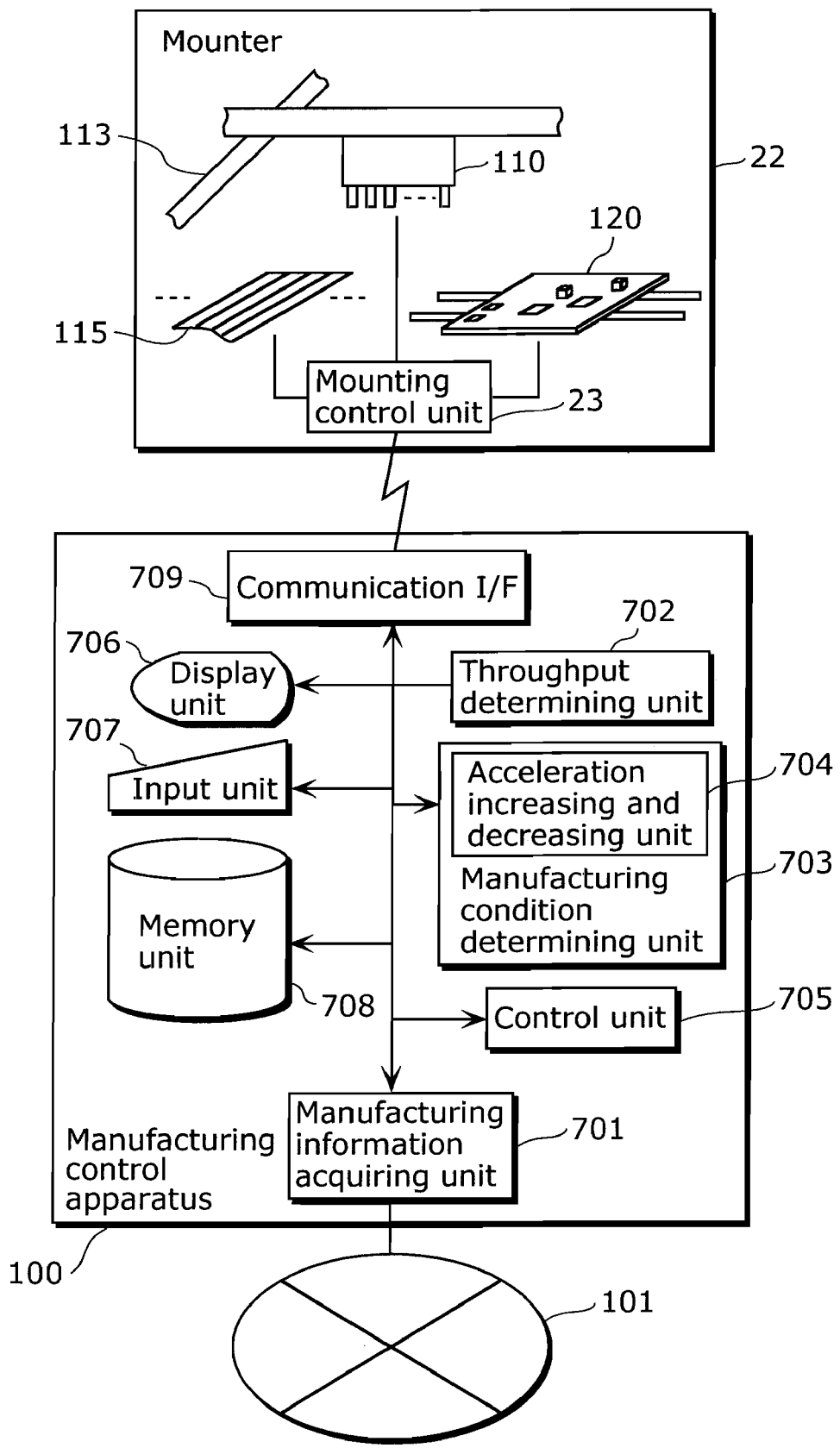
FIG. 27 is a block diagram showing the functional structure of a manufacturing management apparatus.

In addition, the computer 12 has a manufacturing management apparatus 100 (see FIG. 27).

The stockers 14 and 30 are apparatuses for stocking boards. The stocker 14 is located in the uppermost stream and the stocker 30 is located in the downmost stream. In other words, a board which is not yet mounted with a component is stocked in the stocker 14, while a finished board mounted with components is stocked in the stocker 30.

The solder printer 16 is an apparatus for printing a soldering pattern on a board by screen printing technology with the use of pasty solder. In the solder printer 16, a mask on which the soldering pattern is formed is brought into contact with the board, and the soldering pattern is printed through parallel movements of a squeegee while pasty solder is being supplied over the mask.

The conveyors 18 and 26 are apparatuses for transporting the board.

The adhesive applicator 21 is an apparatus for applying adhesive only to a part which requires adhesive for temporarily bonding an electronic component onto the board so that a comparatively large electronic component will not be displaced on the board at the time of transportation or the like. The adhesive applicator 21, for example, applies viscous adhesive, squeezed out of the tank, onto the board by moving the tank and the board alternately so that the adhesive is applied in lines or dots.

The mounters 22 and 24 are apparatuses for mounting components onto boards. The details will be described later.

The reflower 28 is an apparatus for soldering components onto each board by heating the board mounted with the components so as to melt the solder printed by the solder printer 16.

The computer 12 is a computer which controls the whole manufacturing line in a centralized manner. The computer 12 includes the manufacturing management apparatus 100, and manages the manufacturing in each of the manufacturing apparatuses by connecting all the manufacturing apparatuses included in the manufacturing line. The computer 12 is also connected to a network 101 such as the Internet for communicating with other computers such as a sales results management server (not shown).

The term "manufacture" described in the Description and the Claims is used as including all the following operations to be performed by respective manufacturing apparatuses for manufacturing mounted boards: the stocker 14 carrying out boards and the stocker 30 carrying in and stocking the boards; the solder printer 16 printing solders; the conveyers 18 and 26 transporting the boards; the adhesive applicator 21 applying adhesive; the mounters 22 and 24 mounting electronic components onto the boards; and the reflower 28 heating for the purpose of soldering.

Here, the manufacturing management apparatus 100 and the manufacturing management method will be described taking, as a representative example, the mounter 22 in the manufacturing system 10, but other manufacturing apparatuses are also under manufacturing management by the manufacturing management apparatus 100.

Figure 25:
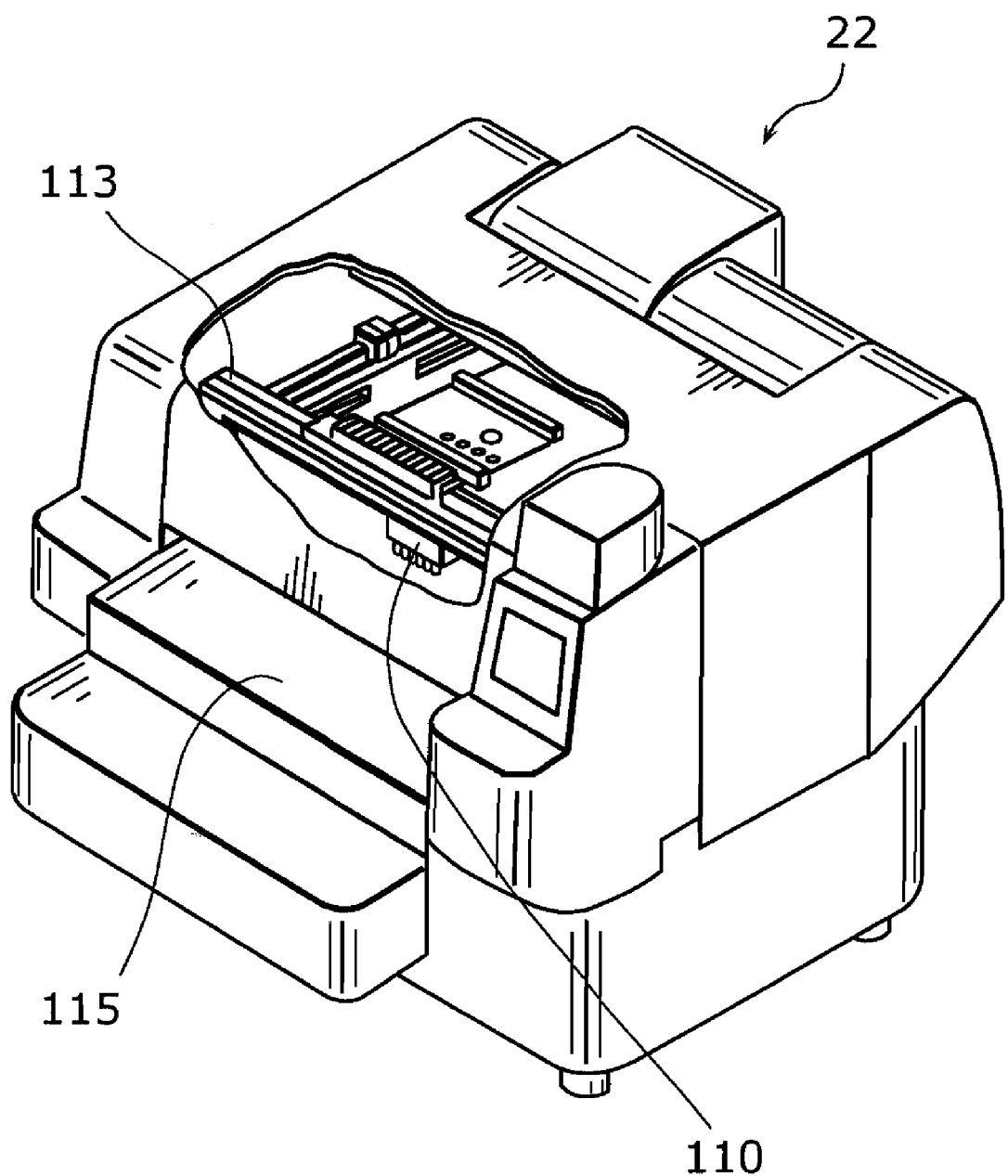
FIG. 25 is an external perspective view, as shown partially cut out, of a mounter to be applied to an embodiment of the present invention.

FIG. 25 is an external perspective view, as shown partially cut out, of the mounter 22 according to an embodiment of the present invention.

The mounter 22 shown in the figure mounts electronic components onto boards received from upstream of the manufacturing line and sends downstream the mounted boards which have been mounted with electronic components. The mounter 22 includes: a multiple head unit 110 which includes plural mounting heads capable of picking up, transporting, and mounting electronic components onto the boards; an X-Y robot 113 which moves the multiple head unit 110 in a horizontal direction; and a component supply unit 115 which supplies components to the mounting heads.

Specifically, this mounter 22 serves as: a mounter which can mount a variety of electronic components, from a small component to a connector; a multi-function mounter which can mount a large electronic component equal to and more than 10 mm in length and width, an irregularly-shaped component such as a switch and a connector, and an IC components such as a Quad Flat Package (QFP) and a Ball Grid Array (BGA); an apparatus in which the multiple head unit 110 can hold plural electronic components at a time and transport them from the component supply unit 115 to a point above the board; and a high-speed mounter which can mount the components at high speed by reducing the reciprocation frequency of the multiple head unit 110 between the component supply unit 115 and the point above the board.

Figure 26:
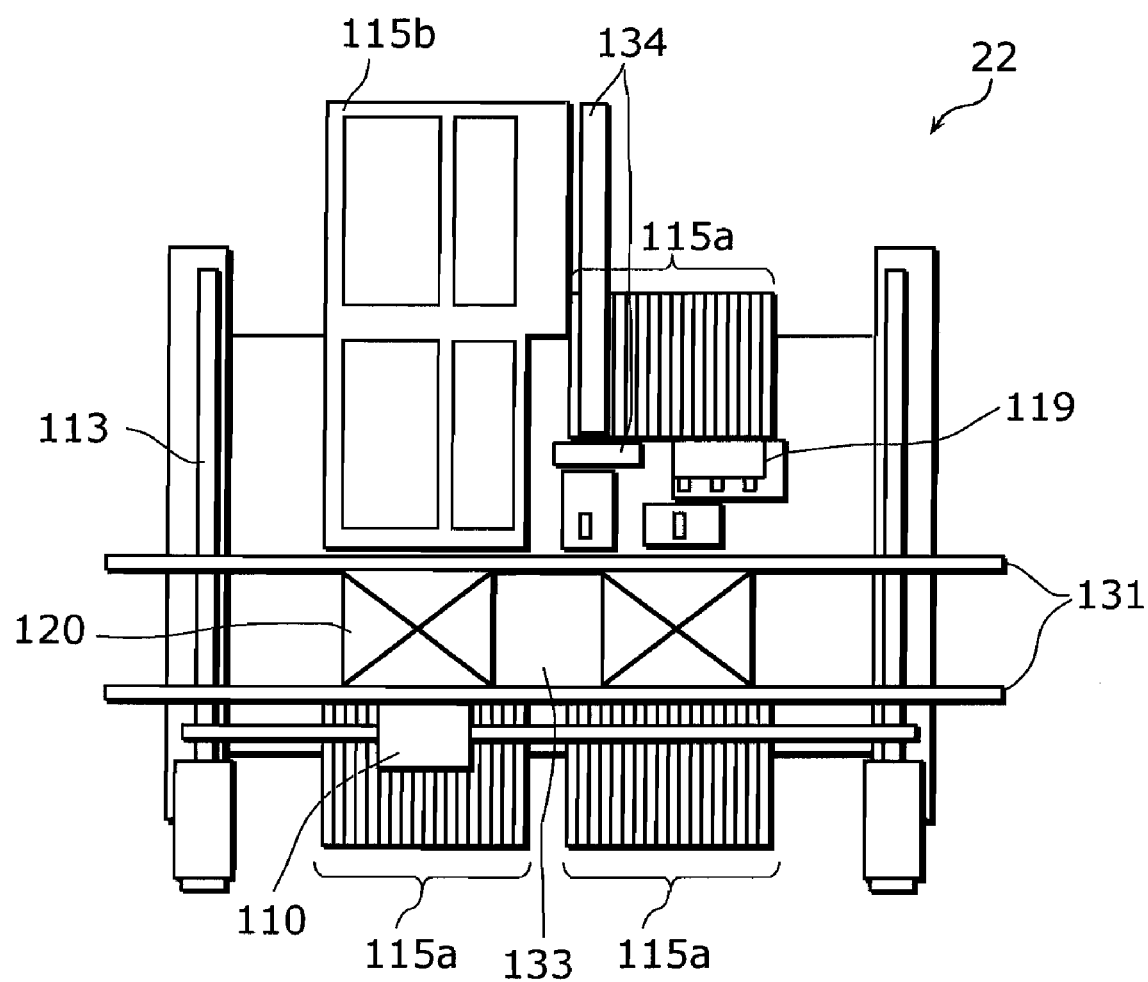
FIG. 26 is a plan view showing the principal internal structure of the mounter.

FIG. 26 is a plan view showing the principal internal structure of the mounter 22.

The mounter 22 also includes: a nozzle station 119 in which exchange nozzles are placed which can be freely exchanged and attached to the mounting head for handling component types of various shapes; rails 131 forming an orbit for transporting a board 120; a mounting table 133 on which the transported board 120 is placed and mounted with electronic components; and a component collecting apparatus 134 which collects a component in the case where the component picked up and held has any defect.

In addition, the component supply unit 115, which is provided before and after the mounter 22, includes a component supply unit 115*a* which supplies each electronic component stored on the tape and a component supply unit 115*b* which supplies the electronic component placed on a plate partitioned according to the size of the component.

For improving the throughput, the multiple head unit 110, which is included in the mounter 22, moves, through the X-Y robot 113, at high speed between the component supply unit 115 and the board 120 placed on the mounting table 133, and between the mounting points on the board 120 at which electronic components are mounted, while remaining stationary over the component supply unit 115 to pick up electronic components and remaining stationary over the mounting point at which the electronic components are to be mounted onto the boards 120. Thus, while each electronic component is being mounted, the multiple head unit 110 repeats moves and stops frequently as moving with very large acceleration and deceleration in every occurrence of move and stop. In addition, driving the multiple head unit 110 with such acceleration and deceleration requires a large amount of power supply.

FIG. 27 is a block diagram showing the functional structure of the manufacturing management apparatus 100.

The manufacturing management apparatus 100 shown in the figure is an apparatus which manages the manufacturing in each apparatus, other than the mounter 22, of the manufacturing line. The manufacturing management apparatus 100 includes: a manufacturing information acquiring unit 701, a throughput determining unit 702, a manufacturing condition determining unit 703, an acceleration increasing and decreasing unit 704, a control unit 705, a display unit 706, an input unit 707, a memory unit 708, and a communication I/F 709.

The manufacturing information acquiring unit 701 is a processing unit which acquires information about manufacturing from the sales results management server (not shown) and each equipment of the manufacturing line via the network 101 and the communication I/F 709. The manufacturing information acquired from the sales results management server by the manufacturing information acquiring unit 701 includes: the latest daily sales quantity of a product in which a mounted board is incorporated; the manufacturing interruption time of the mounter 22; the time for each equipment to start manufacturing; the time at which the manufacturing should be terminated; the quantity of mounted boards that is the number of the mounted boards manufactured by the mounter 22; and the quantity of finished boards that is the number of the mounted boards to be stocked in the stocker 30. In addition, by manually inputting numeric values into the required points on the screen through the input unit 707 and the display unit 706, it is also possible to acquire these numeric values as manufacturing information (see FIG. 31).

The throughput determining unit 702 is a processing unit which determines the throughput of a mounter based on the information acquired from the manufacturing information acquiring unit 701. In addition, the throughput determining unit 702 holds the best throughput for the mounter 22, that is, the throughput value improved up to the limit in consideration for motor rating, component pickup misalignment, component mounting misalignment, and so on.

The manufacturing condition determining unit 703 is a processing unit which determines mounting conditions of the mounter 22 so as to meet the throughput determined by the throughput determining unit 702. Especially, when the throughput determining unit 702 determines to decrease the throughput, the mounting conditions for reducing power consumption is determined within the determined throughput.

Note that since the present embodiment focuses on the mounter 22, mounting conditions are determined by the manufacturing condition determining unit 703. However, in the case of other manufacturing equipment, a manufacturing condition specific to the other manufacturing equipment will be determined.

For example, a condition for reducing power consumption is changing the mounting sequence in addition to decreasing the acceleration of the multiple head unit 110.

Specifically, a description is given of the case where an electronic component A and an electronic component B, which are to be supplied with different types of trays included in the tray-style component supply unit 115b, are mounted in sequential order. As for the tray-style component supply unit, trays stacked in several tiers are stored in the main body of the component supply unit, and the electronic component A and the electronic component B are placed in each tray of the main body of the component supply unit. When supplying the electronic component A, the tray in which the electronic component A is placed is pulled out. When supplying the electronic component B next, the tray is put back into the main body, and the tray in which the electronic component B is placed is pulled out.

For example, assume that a mounting condition with a high throughput is predetermined. More specifically, the mounting condition is that: during the time of tray exchange in which the trays are put back and pulled out, the multiple head unit 110 is transported to mount the electronic component A onto the board 120; the multiple head unit 110 is caused to return to the component supply unit 115b to pick up the electronic component B, and further the multiple head unit 110 is transported to perform mounting onto the board 120. It is possible to reduce power consumption by changing this condition into a mounting condition to reduce the transportation frequency for the multiple head unit 110. In other words, the mounting condition after the change is a mounting condition that: the multiple head unit 110 is kept in standby state without being transported during the time of tray exchange, and the multiple head unit 110 is transported to the board 120 after picking up both the electronic component A and the electronic component B, to mount the electronic component A and the electronic component B.

In this manner, it is possible to reduce power consumption by determining the mounting condition (the mounting sequence of components) such that the frequency of transportation of the multiple head unit 110 will be reduced as much as possible (one transportation is from the point of moving out of a stationary state to the point of moving into another stationary state).

Furthermore, in the case where a mounter includes plural multiple head units which can be independently transported, it is also possible to determine a mounting condition for reducing the throughput as well as reducing power consumption by blocking the power source supplied to a motor for driving any one of the multiple head units. Furthermore, in the case where the mounter 24 can deal with all the mounting processes, it is also possible to determine a mounting condition which requires blocking all the power sources, except for transportation, supplied to the other parts of the mounter 22 such as the multiple head unit 110 and the beam driving unit.

The acceleration increasing and decreasing unit 704 is a processing unit which is included in the manufacturing condition determining unit 703, and which adjusts, in particular, the transportation acceleration of the multiple head unit 110 and so on from among the mounting conditions.

Figure 28:
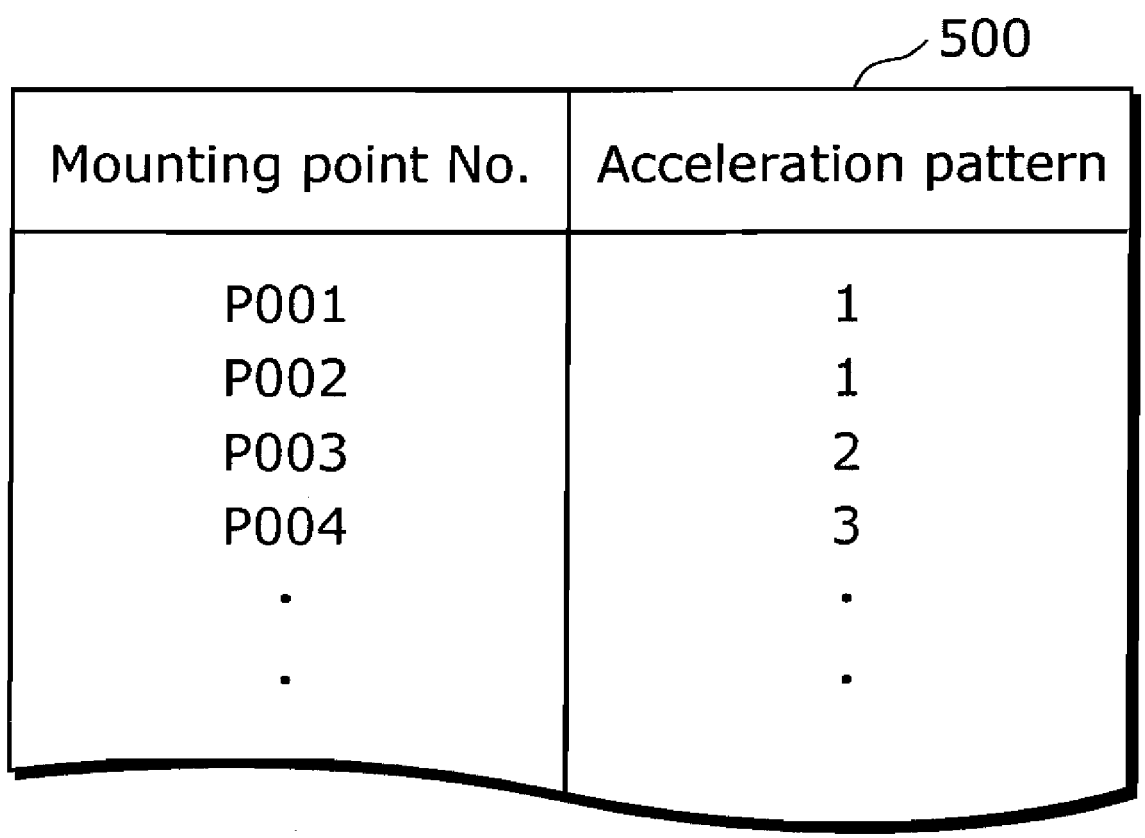
FIG. 28 is a diagram showing an example of acceleration data.

For example, such acceleration data 500 as shown in FIG. 28 are used for adjusting acceleration. The acceleration data 500 shown in the figure are stored in the memory unit 708, and includes information which shows each transportation section in which the multiple head unit 110 is transported and acceleration generated in the transportation section. Note that each transportation section, which corresponds to each mounting point on the board, is differentiated by mounting point No., while acceleration is defined by a numeral corresponding to each predetermined degree of acceleration (from degree one to nine, for example), and the smaller the numeral, the higher the acceleration. Furthermore, when making an adjustment of acceleration, the mounting condition is determined by increasing or decreasing the numeral for the acceleration pattern for each transportation section or for all transportation sections at a time so that the target throughput will be obtained.

Note that the acceleration data 500 are created by setting the largest acceleration possible within a non-problematic range for mounting quality as the upper limit. In addition, the non-problematic range is a range to be determined based on the rating torque of the motor which drives each moving member of the mounter 22 and a range in which an electronic component, held by the multiple mounting head 112, is not misaligned or dropped by inertial force which accompanies acceleration and deceleration generated at the time when the multiple mounting head 110 is transported. Therefore, even when an adjustment is made to increase acceleration in the acceleration increasing and decreasing unit 704, it is regarded as impossible to set acceleration to equal to or higher than the acceleration data 500 (by setting the numeral smaller).

Note that in some cases "acceleration" is called or described as "speed" in the sense of acceleration by those skilled in the art, and thus the speed may also be adjusted by understanding "speed" as "acceleration."

The reason for adjusting acceleration above all mounting conditions is that acceleration has a large influence on the throughput, and particularly that decreasing acceleration significantly contributes to power savings.

Here, "acceleration" means acceleration in a broad sense, including all the acceleration generated in the mounter 22, that is: horizontal acceleration generated at the time when the multiple head unit 110 is transported, and additionally vertical acceleration generated at the time when the mounting head included in the multiple head unit 110 picks Lip and mounts components.

Note that in this embodiment the manufacturing condition determining unit 703 is included in the manufacturing management apparatus 100 and thus a manufacturing condition is determined in the manufacturing management apparatus 100 to meet the throughput having been determined in the throughput determining unit 702. However, the present invention is not limited to this, and the manufacturing condition determining unit may also be included in each manufacturing apparatus such as the mounter 22. In this case, by transmitting to each manufacturing apparatus the throughput determined by the throughput determining unit 702, each manufacturing apparatus determines the manufacturing condition independently, and based on the determined condition, manufacturing is performed. The operation of each processing unit to be described below is the same irrespective of where any of the processing units is located.

The control unit 705 is a processing unit which controls each processing unit included in the manufacturing management apparatus 100.

The display unit 706 has a CRT, a LCD or the like, while the input unit 707 has a keyboard, a mouse, a touch panel or the like. These are used, for example, for displaying the operating condition of the mounter 22 or for manually inputting manufacturing information.

The memory unit 708 is a memory device including a hard disk drive which can store and maintain the data, and stores the acceleration data 500 described above and so on.

The communication I/F 709 is an interface which transmits and receives information with the mounter 22 (including other apparatuses included in the manufacturing line).

Next, the processing operation of the manufacturing management apparatus 100 for the mounter 22 will be described.

Figure 29:
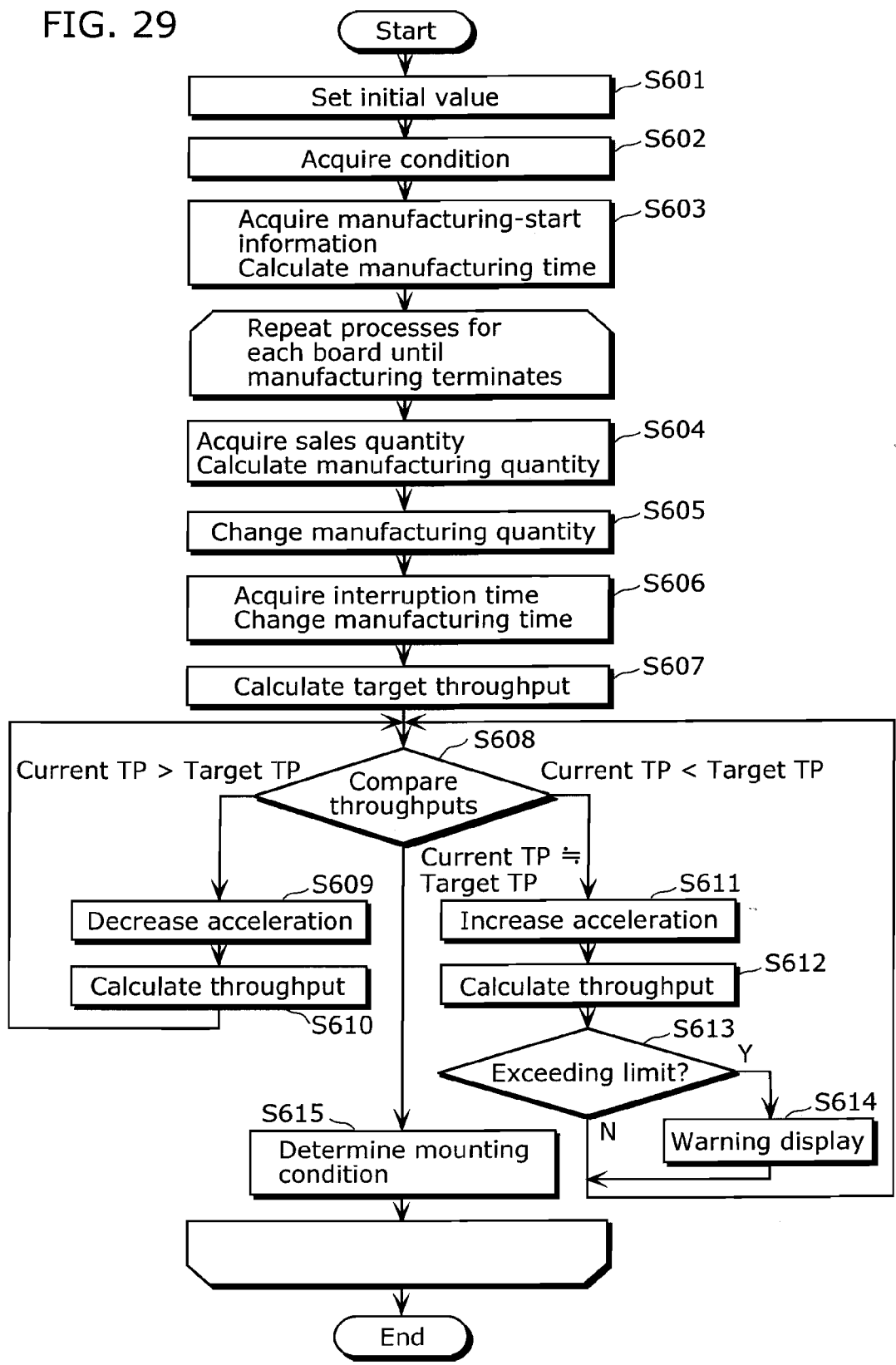
FIG. 29 is a flowchart showing the processing operations of the manufacturing management apparatus.

FIG. 29 is a flowchart showing the processing operation of the manufacturing management apparatus.

First, the manufacturing management apparatus 100 acquires and sets initial data as the default value (S601). The initial data include: for the whole manufacturing line, the number of mounted boards to be manufactured; the time to start manufacturing; and the time to terminate manufacturing. These initial data are acquired from a manufacturing plan, an operating plan for the manufacturing line, and so on. Note that this step is not essential.

Next, the manufacturing condition determining unit 703 determines, for the mounter 22, a mounting condition including the arrangement of each electronic component in the component supply unit 115 and the mounting sequence of electronic components based on the acceleration data 500 and the component library 700 (See FIG. 30) so as to obtain the best throughput, and acquires this determined condition (S602). Note that in the case where the manufacturing condition determining unit 703 is included in an apparatus other than the manufacturing management apparatus 100 (for example, the mounter 22) as described earlier, this step is executed by the manufacturing condition determining unit included in the apparatus other than the manufacturing management apparatus 100, and the determined condition is acquired by the manufacturing management apparatus 100.

Next, the mounter 22 starts manufacturing on receipt of the board carried in first from an upstream process of the manufacturing line, while transmitting manufacturing start information of the mounter 22 to inform that the manufacturing has started. Furthermore, the manufacturing management apparatus 100 acquires the manufacturing start information of the mounter 22 and calculates the manufacturing time (S603). The manufacturing start information indicates that the mounter 22 has actually started manufacturing, and when managing the manufacturing of the mounter 22, the manufacturing time is calculated based on the time at which the manufacturing start information is received. Specifically, the manufacturing time for the mounter 22 is calculated by: deducting, from the last time allowed for the manufacturing system 10, the time at which the manufacturing start information is received; and the time lag between the time at which the mounter 22 terminates manufacturing and the time at which the entire manufacturing system 10 terminates manufacturing.

Next, the manufacturing information acquiring unit 701 acquires sales quantity that is the number of target products having been sold in the previous day from the sales results management server, and calculates the manufacturing quantity that is the quantity of boards to be manufactured for today, based on the acquired sales quantity (S604).

Furthermore, the manufacturing information acquiring unit 701 changes the manufacturing quantity based on the difference between the quantity of boards having been manufactured by the mounter 22 and the quantity of boards having been received by the stocker 30 (S605). This is for compensating for the difference between the finished mounted boards and the mounted boards having been manufactured by the mounter 22, in the case where any mounted board having been manufactured by the mounter 22 is removed due to occurrence of trouble in the downstream of the manufacturing line. Accordingly, the quantity of mounted boards to be manufactured by the mounter 22 is equal to or larger than the manufacturing quantity having been calculated in Step S604 by the quantity of boards having been removed.

Note that downstream processes may include a process of checking each manufactured mounted board to check whether the mounted board is defective or non-defective. In this case, since any mounted board judged as defective is removed, the quantity of mounted boards having been manufactured by the mounter 22 is equal to or larger than the manufacturing quantity calculated in Step S604 by the quantity of the removed boards.

Furthermore, the yield of mounted board manufacturing may be acquired in advance and increase the quantity of mounted boards to be manufactured by the mounter 22 based on the yield.

In addition, since time lag occurs until a board manufactured by the mounter 22 has passed through the downstream processes of the manufacturing line and is stocked in the stocker 30, the manufacturing quantity is changed by taking this time lag into consideration.

Furthermore, the manufacturing information acquiring unit 701 acquires the time for which the mounter 22 has interrupted manufacturing, and deducts this value from the manufacturing time (S606). Note that the interruption of operation includes: the case of interruption due to trouble with the mounter 22 or any addition or exchange of parts; the case where the board is not carried in due to a delay occurring in any upstream or downstream process of the manufacturing line or as a result of the throughput for any upstream manufacturing apparatus having reached the limit; and the case where operation is interrupted as the board is not carried in or cannot be carried out.

Next, based on the manufacturing information acquired by the manufacturing information acquiring unit 701, the throughput determining unit 702 calculates and determines the target throughput that should be realized by the mounter 22 (S607). Specifically, the manufacturing time (remaining manufacturing time) is updated by deducting the time having already been spent on manufacturing (manufacturing elapsed time) from the preset manufacturing time (initially set manufacturing time), while the manufacturing quantity (remaining manufacturing quantity) is updated by deducting the quantity of boards the manufacturing of which is currently terminated (manufacturing termination quantity) from the manufacturing quantity (acquired manufacturing quantity) acquired by the manufacturing information acquiring unit 701. Based on the manufacturing time and the manufacturing quantity after update, the target throughput is calculated. In principle, it is possible to calculate an approximate throughput by dividing the manufacturing quantity by the manufacturing time, although minute corrections are performed, such as error correction when manufacturing starts and terminates, and rounding up an indivisible value.

This is represented as the following expressions:

Manufacturing time (remaining manufacturing time)= initially set manufacturing time−manufacturing elapsed time Manufacturing quantity (remaining manufacturing quantity)=acquired manufacturing quantity−manufacturing termination quantity Target throughput=manufacturing quantity÷manufacturing time Next, when the throughput currently achieved by the mounter 22 is compared with the above target throughput (S608), and when the current throughput is faster than the target throughput (S608: current TP>target TP), acceleration is decreased (S609), and the throughput is recalculated based on the decreased acceleration. Steps S608 and S609 are repeated until the throughput that is the closest to the target throughput and not slower than the target throughput is calculated.

For a specific calculation method of throughput, takt time for each transportation section is calculated from acceleration, and the throughput is calculated from the total value of the takt times for all transportation sections.

Note that for a procedure for decreasing acceleration, it is possible to give an example of a procedure of decreasing acceleration for every transportation section by one level, and further, decreasing acceleration for each transportation section for minor adjustments.

On the other hand, when the current throughput is slower than the target throughput (S608: current TP<target TP), acceleration is increased (S611), and the throughput is recalculated based on the increased acceleration. In the case where the recalculated throughput exceeds the limit (S613: Y), a warning is shown in the display unit 706 (S614).

In the case where the recalculated throughput does not exceed the limit value (S613:Y), Steps from S611 to S613 are repeated until the throughput which is the closest to the target throughput and not slower than the target throughput is calculated.

Note that for a procedure for increasing acceleration as with the above procedure for decreasing acceleration, it is possible to give an example of a procedure of increasing acceleration for every transportation section by one level, and further increasing acceleration for each transportation section for minor adjustments.

Thus, when the calculated throughput is the closest to the target throughput (S608: current TP≈target TP), the mounting condition is determined based on the predetermined acceleration (S615).

When the mounting condition is determined, the numeric part of the screen display shows, as shown in FIG. 31, numeric values such as the operating rate of boards A and acquired information.

Note that "planned" or "schedule" in the figure is a numeric value that has been initially set, while "acquired" is a value which is gained in real time; that is, a value changed later from the initially set value.

The above steps from S604 to S615 are performed every time a mounted board is manufactured by the mounter 22 and repeated until reaching the required manufacturing quantity.

By applying the above-described manufacturing management apparatus 100 and the manufacturing management method to the mounter 22, it is possible to manufacture the precise quantity of mounted boards based on the latest information since the throughput is being adjusted in real time while the mounter 22 is manufacturing mounted boards of the same kind in sequence. Furthermore, in the case where the mounter 22 is not being utilized to its full capacity, the capacity margin can be utilized for saving energy.

In addition, when the acquired manufacturing information exceeds the manufacturing capacity, a warning is displayed to let inventory shortage known in advance, which makes it possible to request backups from all parties concerned including other manufacturing lines.

Note that in the above description, a comparison of throughputs is made on a per single board basis; however, this is not the only case, and such comparison can be made at arbitrary timing, for example, on a per plural boards basis.

In addition, in the above processing operation, the adjustment of the throughput is described with an example of increasing and decreasing acceleration. However, the present invention is not limited to this, and the throughput may also be adjusted by changing other mounting conditions, for example, changing the mounting sequence.

In addition, although "throughput" is used throughout the descriptions and illustrations in the Description and Claims, it goes without saying that the advantageous effect can be obtained even if "throughput" is replaced by "takt time" (the time between the time when a board is carried in and the time when the finished board is carried out).

In addition, although the above description has been limited to the mounter 22, the present invention, as described earlier, is applicable to every manufacturing apparatus included in the manufacturing line.

In addition, the manufacturing management apparatus and the manufacturing equipment need not have a separate main body, and each manufacturing equipment may have a manufacturing management apparatus. Furthermore, each processing unit included in the manufacturing management apparatus may be a separate unit. In other words, for the present invention, the advantageous effect does not change according to the physical location at which each processing unit is located.

In addition, the manufacturing information may include not only the information described above but also shipment inventory or process inventory. In addition, the throughput may also be autonomously determined in the case where manufacturing information is process inventory or the like.

The present invention is applicable to a mounter which manufactures a mounted board that is a board mounted with components, and particularly applicable to a manufacturing line or the like which includes plural mounters and manufactures a circuit board mounted with electronic components.

The invention claimed is:

1. A manufacturing management method for managing board manufacturing performed by a mounter which mounts a component onto a board, the method comprising:
   a manufacturing information acquiring step of acquiring manufacturing information included in a manufacturing plan during a period when the mounter is mounting the component onto the board;
   a throughput determining step of determining a throughput of the mounter for the board during the period when the mounter is mounting the component onto the board, based on the manufacturing information; and
   a manufacturing condition determining step of determining a manufacturing condition so that power consumption of the mounter decreases with a throughput within a range which is not lower than the throughput determined in said throughput determining step, when the determined throughput is lower than a current throughput of the mounter.

2. The manufacturing management method according to claim 1,
   wherein said manufacturing information acquiring step further includes
   a board inventory quantity calculating step of calculating an inventory quantity of boards to be manufactured by the mounter, and
   said throughput determining step further includes
   a board manufacturing quantity control step of controlling a manufacturing quantity of boards manufactured by the mounter so that the inventory quantity is equal to or smaller than a predetermined optimum inventory quantity.

3. The manufacturing management method according to claim 2,
   wherein the board manufacturing performed by a mounting line is managed, the mounting line including a plurality of mounters each of which mounts a component onto the board, and
   said board manufacturing quantity control step includes, in the case where the inventory quantity is equal to or larger than the optimum inventory quantity, controlling the manufacturing quantity of boards by increasing manufacturing time for the board in at least one of the mounters included in the mounting line.

4. The manufacturing management method according to claim 3,
   wherein said board manufacturing quantity control step includes, in the case where the inventory quantity is equal to or larger than the optimum inventory quantity, controlling the manufacturing quantity of boards by decreasing the number of mounters to be used in component mounting.

5. The manufacturing management method according to claim 2, further comprising a display step of displaying the inventory quantity.

6. The manufacturing management method according to claim 2,
   wherein the inventory quantity is a quantity of boards to be shipped from a factory, and
   said board inventory quantity calculating step includes:
   a step of acquiring an order quantity of boards;
   a step of acquiring a current inventory quantity which is an inventory quantity before a start of board manufacturing, and
   a step of calculating the inventory quantity of boards based on the manufacturing quantity of boards per unit time, the current inventory quantity, and the order quantity.

7. The manufacturing management method according to claim 2,
   wherein the inventory quantity is an inventory quantity of boards generated in relation to the manufacturing quantity of boards by other mounting lines, and
   said board inventory quantity calculating step includes:
   a step of acquiring a current inventory quantity which is an inventory quantity before a start of board manufacturing;
   a step of calculating a line takt time that is a time for manufacturing the board for the current mounting line and each of the other mounting lines; and
   a step of calculating the inventory quantity of boards based on the current inventory quantity, predetermined unit time, and line takt time for the current mounting line and the other mounting lines.

8. The manufacturing management method according to claim 1,
   wherein the inventory quantity of boards manufactured by the mounter is simulated, the mounter mounting the component onto the board,
   said manufacturing information acquiring step includes a manufacturing condition input accepting step of accepting an input of a manufacturing condition for the mounter, and
   said throughput determining step includes a simulation step of causing a computer to simulate the inventory quantity of boards based on the manufacturing condition.

9. The manufacturing management method according to claim 8, further comprising a graph display step of displaying, as a graph, a transition of the simulated inventory quantity of boards.

10. The manufacturing management method according to claim 9,
    wherein said graph display step further includes displaying whether or not the inventory quantity of boards is within a range of a predetermined optimum inventory.

11. The manufacturing management method according to claim 1,
    wherein the manufacturing information acquired in said manufacturing information acquiring step includes the manufacturing quantity of boards or manufacturing time within which the manufacturing quantity should be manufactured.

12. The manufacturing management method according to claim 1,
wherein said manufacturing information acquiring step further includes a sales quantity acquiring step of acquiring the sales quantity of a product in which the board manufactured by the mounter is incorporated, and
the manufacturing quantity of boards is acquired based on the acquired sales quantity.

13. The manufacturing management method according to claim 1,
wherein said manufacturing condition determining step further includes a mounting acceleration decreasing step of decreasing a throughput by decreasing acceleration that is generated while the mounter is in operation.

14. A manufacturing management apparatus which manages board manufacturing performed by a mounter which mounts a component onto a board, the apparatus comprising:
a manufacturing information acquiring unit operable to acquire manufacturing information included in a manufacturing plan during a period when the mounter is mounting the component onto the board;
a throughput determining unit operable to determine a throughput for the board during the period when the mounter is mounting the component onto the board, based on the manufacturing information; and
a manufacturing condition determining unit operable to determine a manufacturing condition so that power consumption decreases within a range of the determined throughput, when said throughput determining unit determines to decrease the throughput.

15. The manufacturing management apparatus according to claim 14,
wherein said manufacturing information acquiring unit includes a board inventory quantity calculating unit operable to calculate the inventory quantity of boards manufactured by the mounter, and
said throughput determining unit includes a board manufacturing quantity control unit operable to control the manufacturing quantity of boards by the mounter so that the inventory quantity is equal to or smaller than a predetermined optimum inventory quantity.

16. The manufacturing management apparatus according to claim 14,
wherein said manufacturing information acquiring unit includes a manufacturing condition input accepting unit operable to accept an input of a manufacturing condition for the mounting line, and
said throughput determining unit includes
a simulation unit operable to simulate the inventory quantity of boards based on the manufacturing condition.

17. The manufacturing management apparatus according to claim 14,
wherein said manufacturing information acquiring unit acquires manufacturing information included in a manufacturing plan while the mounter is manufacturing the board, and
said throughput determining unit determines a throughput of the mounter for the boards based on the manufacturing information while the manufacturing equipment is manufacturing a sequence of the boards.

18. A mounter, comprising:
a component mounting unit operable to mount a component onto a board;
a manufacturing information acquiring unit operable to acquire manufacturing information included in a manufacturing plan during a period when said mounter is mounting the component onto the board;
a throughput determining unit operable to determine a throughput for the board during the period when said mounter is mounting the component onto the board, based on the manufacturing information; and
a manufacturing condition determining unit operable to determine a manufacturing condition so that power consumption decreases within a range of the determined throughput, when said throughput determining unit determines to decrease the throughput.

* * * * *